(12) United States Patent
Takahashi et al.

(10) Patent No.: US 8,268,540 B2
(45) Date of Patent: Sep. 18, 2012

(54) METHOD OF MANUFACTURING LIGHT RECEIVING DEVICE

(75) Inventors: Toyosei Takahashi, Tokyo (JP); Junya Kusunoki, Tokyo (JP); Kazuto Oonami, Tokyo (JP); Mitsuo Sugino, Tokyo (JP); Masakazu Kawata, Tokyo (JP); Rie Takayama, Tokyo (JP); Seiji Oohashi, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 784 days.

(21) Appl. No.: 11/886,262

(22) PCT Filed: May 30, 2007

(86) PCT No.: PCT/JP2007/000578
§ 371 (c)(1),
(2), (4) Date: Sep. 13, 2007

(87) PCT Pub. No.: WO2007/141909
PCT Pub. Date: Dec. 13, 2007

(65) Prior Publication Data
US 2009/0226848 A1    Sep. 10, 2009

(30) Foreign Application Priority Data
Jun. 7, 2006   (JP) ................................. 2006-159005

(51) Int. Cl.
*G03F 7/20*    (2006.01)

(52) U.S. Cl. ....................................... 430/321; 430/311
(58) Field of Classification Search .................. 430/325, 430/322, 311, 321
See application file for complete search history.

(56) References Cited

U.S. PATENT DOCUMENTS

| | | | |
|---|---|---|---|
| 2002/0153096 A1* | 10/2002 | Giardello et al. | 156/334 |
| 2002/0193526 A1* | 12/2002 | Adachi et al. | 525/214 |
| 2004/0161871 A1* | 8/2004 | Omori | 438/68 |
| 2005/0277268 A1 | 12/2005 | Hoshika | |
| 2006/0043544 A1 | 3/2006 | Tsukamoto et al. | |

FOREIGN PATENT DOCUMENTS

| | | | |
|---|---|---|---|
| JP | 4-61379 | | 2/1992 |
| JP | 04-61379 | * | 2/1992 |
| JP | 2005-252183 | | 9/2005 |
| JP | 2006-5025 | | 1/2006 |
| JP | 2006-73546 | | 3/2006 |

OTHER PUBLICATIONS

International Search Report.

* cited by examiner

*Primary Examiner* — Brittany Raymond
(74) *Attorney, Agent, or Firm* — Smith, Gambrell & Russell, LLP

(57) ABSTRACT

A method of manufacturing a light receiving device 1 includes: providing a resin layer 14 containing a photo curing resin on a transparent substrate 13 where a plurality of transparent substrate portions 13A are integrated so that the resin layer covers the transparent substrate 13; selectively irradiating the resin layer 14 with light, followed by a developing process, so that the resin layer 14 remains in regions of the transparent substrate 13 which surround portions corresponding to regions facing light receiving portions 11 in the transparent substrate portions 13A; dividing the transparent substrate 13 into units of transparent substrate portions 13A so that a plurality of transparent substrate portions 13A are obtained; dividing the base substrate 12 into units of base substrate portions 12A so that a plurality of base substrate portions 12A are obtained; and joining the base substrate portions 12A and the transparent substrate portions 13A via the resin layer 14.

16 Claims, 11 Drawing Sheets

METHOD OF MANUFACTURING LIGHT RECEIVING DEVICE

TECHNICAL FIELD

The present invention relates to a method of manufacturing a light receiving device.

BACKGROUND ART

A solid state image sensing device 100 provided with a semiconductor substrate (base substrate portion) 101 and a transparent lid portion (transparent substrate portion (102)) as that shown in FIG. 10 is publicly known as a conventional light receiving device. When this solid state image sensing device 100 is manufactured, as shown in FIG. 11(A), a substrate 103 where a plurality of effective pixel regions 105 are provided, for example, is prepared. The substrate 103 becomes a semiconductor substrate 101. Next, the frame of adhesive layer 104 is formed on this substrate 103 so as to surround the effective pixel region 105. After that, the substrate 103 and a transparent plate material 106 which becomes the transparent lid portion 102 are pasted together via an adhesive layer 104. Furthermore, as shown in FIG. 11(C), the substrate 103 and the transparent plate material 106 are diced. As a result, a solid state image sensing device 100 provided with a semiconductor substrate 101 and a transparent lid portion 102 is obtained (see for example Patent Document 1).

In addition, there is also a method for dicing the transparent plate material 106 in advance so that a plurality of transparent lid portions 102 can be placed on the substrate 103 as a method of manufacturing a solid state image sensing device. According to this method, the substrate 103 is diced after the plurality of transparent lid portions 102 are placed on the substrate 103 (see for example Patent Document 1).

[Patent Document 1]
Japanese Laid-open patent publication No. 2006-73546

DISCLOSURE OF THE INVENTION

According to the method of dicing the substrate 103 and the transparent plate material 106 after they are pasted together, in the case where the transparent plate material 106 shifts in position or inclines relative to the substrate 103 when they are pasted together, the semiconductor substrate 101 and the transparent lid portion 102 shift in position or the transparent lid portion 102 inclines relative to the semiconductor substrate 101 in a great number of light receiving devices.

Accordingly, there is a possibility that the yield in the manufacture of light receiving devices may lower.

In addition, according to the method of dicing the transparent plate material 106 in advance so that a plurality of transparent lid portions 102 can be placed on the substrate 103, the substrate 103 is diced after the plurality of transparent lid portions 102 are placed on the substrate 103, and therefore, there is a possibility that the transparent lid portions 102 may be damaged through dicing, and thus, it is difficult to manufacture light receiving devices having high reliability. Therefore, there is a possibility that the yield in the manufacture of light receiving devices may lower.

An object of the present invention is to provide a method of manufacturing a light receiving device where the yield in the manufacture can be increased.

According to the present invention, there is provided a method of manufacturing a light receiving device, the light receiving device including a light receiving portion, a base substrate portion where this light receiving portion is provided, and a transparent substrate portion which is placed so as to face the base substrate portion and the light receiving portion, where a resin layer containing a photo curing resin is placed between the transparent substrate portion and the base substrate portion so as to surround the light receiving portion, wherein the method of manufacturing a light receiving device includes: providing a resin layer containing a photo curing resin on a transparent substrate where a plurality of transparent substrate portions are integrated or on a base substrate where a plurality of light receiving portions are provided and a plurality of base substrate portions are integrated in such a manner that the resin layer covers the base substrate or the transparent substrate; selectively irradiating the resin layer with light followed by a developing process so that the resin layer remains in regions surrounding at least the respective light receiving portions on the base substrate or in regions of the transparent substrate which surround portions corresponding to the regions facing the light receiving portions of the transparent substrate portions; dividing the base substrate into units of the base substrate portions so that a plurality of the base substrate portions are obtained; dividing the transparent substrate into units of the transparent substrate portions so that a plurality of the transparent substrate portions are obtained; and joining the base substrate portion and the transparent substrate portion via the resin layer.

According to the present invention, a base substrate and a transparent substrate are respectively divided, and after that, the base substrate portion and the transparent substrate portion are joined. Therefore, the base substrate portion and the transparent substrate portion are positioned for each light receiving device, and thus, the transparent substrate portions and the base substrate portions can be prevented from shifting in position and the like in many light receiving devices at the same time, unlike in the conventional art. As a result, the yield in the manufacture can be increased.

In addition, the portions are joined after the base substrate and the transparent substrate are respectively divided, and therefore, the transparent substrate portion can be prevented from being damaged when the base substrate is divided. As a result of this also, the yield in the manufacture can be increased.

In addition, the present invention provides method of manufacturing a light receiving device, the light receiving device including a support substrate where a light receiving element having a light receiving portion and a base substrate portion provided with this light receiving portion is installed, and a transparent substrate portion which is placed so as to face the surface of the support substrate on which the light receiving element is provided, where a resin layer containing a photo curing resin is placed between the support substrate and the transparent substrate portion so as to surround the light receiving element, and the method of manufacturing a light receiving device comprises: providing a resin layer containing a photo curing resin on a transparent substrate where a plurality of transparent substrate portions are integrated in such a manner that the resin layer covers the transparent substrate; selectively irradiating the resin layer with light followed by a developing process so that the resin layer remains so as to surround portions corresponding to the regions of the transparent substrate facing the light receiving elements in the transparent substrate portions; dividing the transparent substrate into units of the transparent substrate portions so that a plurality of the transparent substrate portions are obtained; and joining the support substrate and the transparent substrate portion via the resin layer after the light receiving element is installed on the support substrate.

In this configuration according to the present invention, support substrate where light receiving element having a base substrate portion is installed and transparent substrate portion obtained by dividing the transparent substrate are joined. Therefore, the base substrate portion and the transparent substrate portion can be positioned with precision for each light receiving device, and thus, the transparent substrate portions and the base substrate portions can be prevented from shifting in position and the like in a great number of light receiving devices at the same time, unlike in the conventional art. As a result, the yield in the manufacture can be increased.

In addition, the transparent substrate portion and the support substrate where a light receiving element is installed, are joined after the transparent substrate is divided, and dicing is not carried out after joining, and therefore, the transparent substrate portion can be prevented from being damaged. As a result, the yield in the manufacture can be increased.

At this time, it is preferable for the resin layer to have adhesive properties.

Furthermore, it is preferable for the resin layer to be formed of a resin composition including the photo curing resin and a filler, and to have a moisture permeability of 30 $[g/m^2 \cdot 24\ h]$ or higher when measured in accordance with the JIS Z0208 B method.

When the resin layer is formed of a resin composition including a photo curing resin and a filler and has a moisture permeability of 30 $[g/m^2 \cdot 24\ h]$ when measured in accordance with the JIS Z0208 B method, air permeability can be secured between the inner space of the light receiving device surrounded by the resin layer and the outer space outside the resin layer. As a result, condensation can be prevented in the transparent substrate portion and the base substrate portion from occurring.

It is preferable for the filler to include zeolite.

As a result, the moisture permeability of the resin layer can be increased.

Furthermore, it is preferable for the resin layer to further include a curing resin which can be cured both by light and heat, and it is preferable for the curing resin which can be cured both by light and heat to include a (meth)acrylic modified phenolic resin or a (meth)acryloyl group-containing (meth)acrylate polymer.

In addition, the above step in which the resin layer remains after the developing process may include, at a later stage, providing an adhesive layer on a surface of the resin layer, the support substrate and the transparent substrate portion may be joined via the resin layer and the adhesive layer, or, the base substrate portion and the transparent substrate portion may be joined via the resin layer and the adhesive layer, and the resin layer may include a cyclic olefin resin as the photo curing resin.

In particular, it is preferable for the cyclic olefin resin to be a norbornene resin.

When the resin layer includes a cyclic olefin resin, moisture can be prevented from penetrating into the inner space surrounded by the resin layer. As a result, condensation can be prevented in the transparent substrate portion and the base substrate portion from occurring.

BRIEF DESCRIPTION OF THE DRAWINGS

The above-described objects, other objects, features and advantages are further clarified in the preferred embodiments which will be described below and the following accompanying drawings.

BEST MODE FOR CARRYING OUT THE INVENTION

Figure 1:
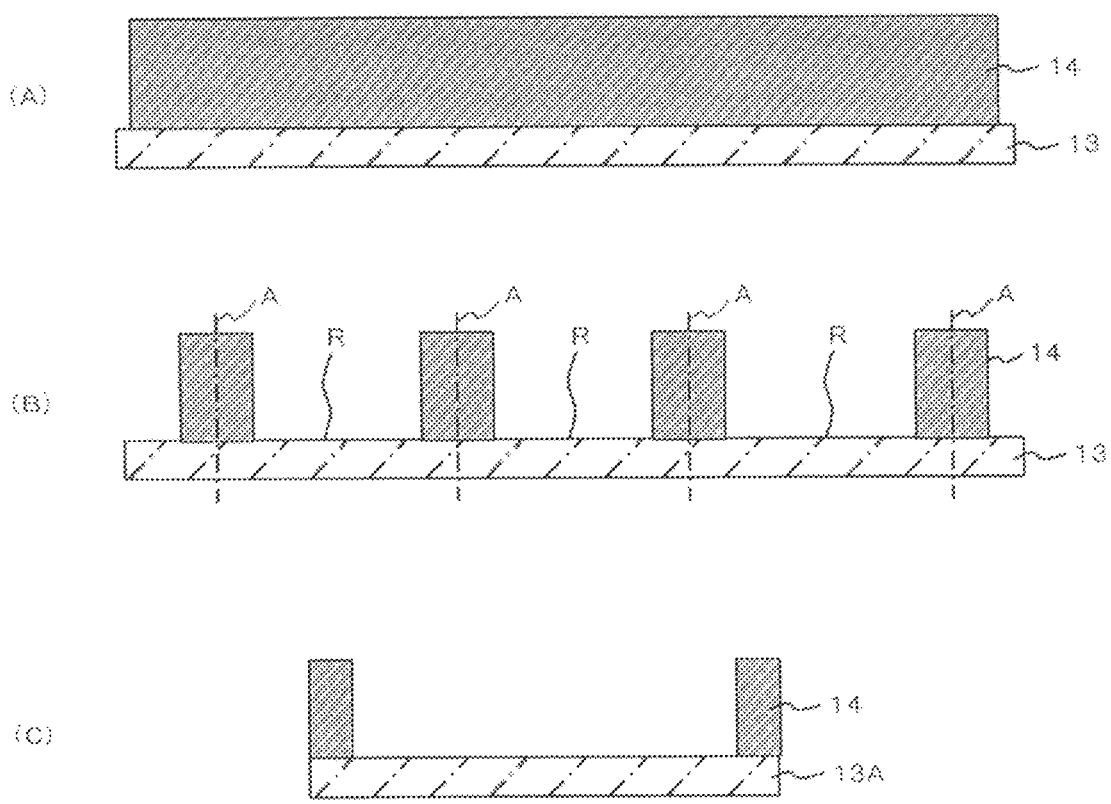
FIG. 1 are views showing a light receiving device during the manufacturing process according to the first embodiment of the present invention.
Figure 2:
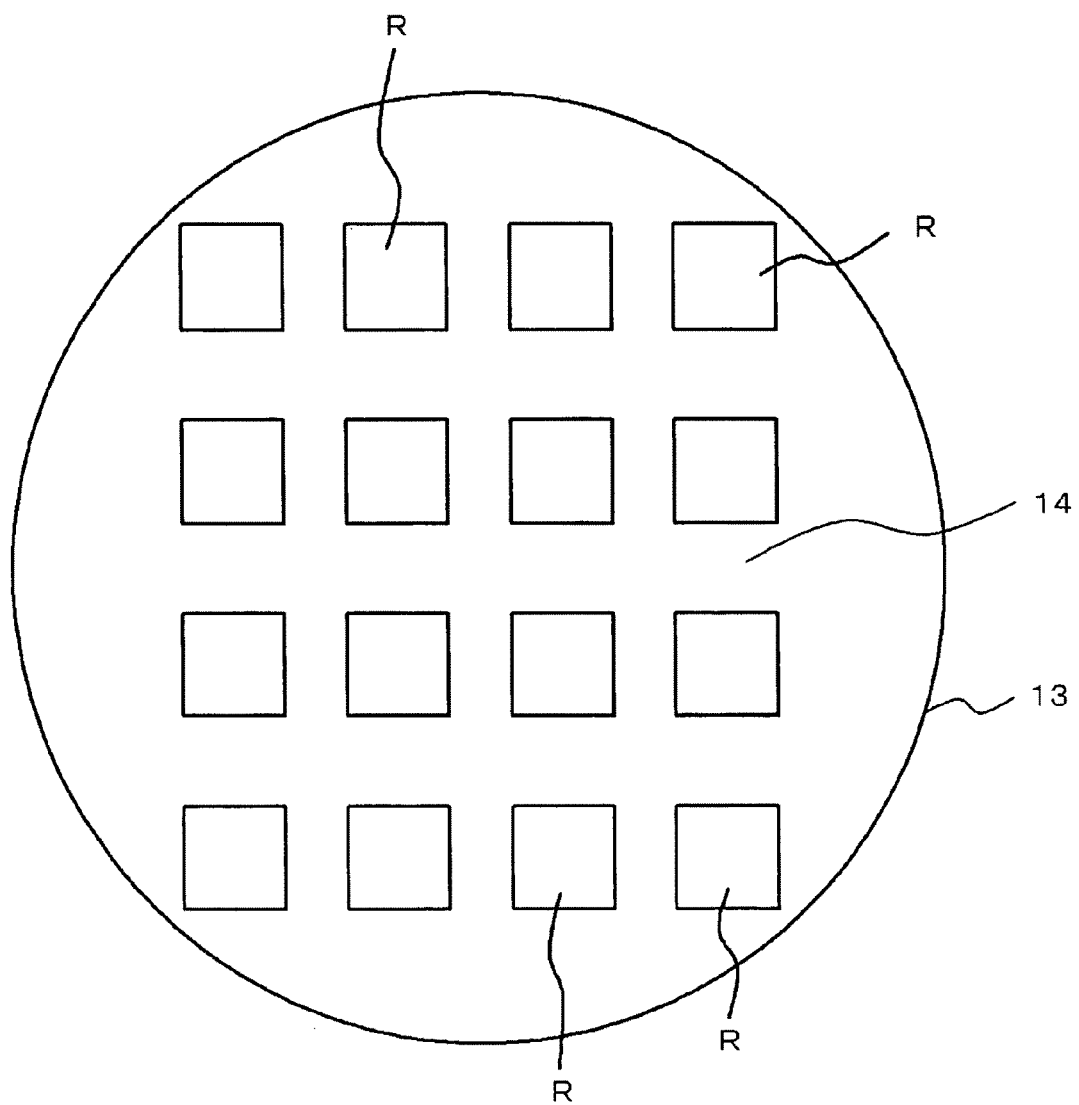
FIG. 2 is a plan view showing the state when a resin layer is provided on a transparent substrate.

In the following, the embodiments of the present invention are described with reference to the drawings.
(First Embodiment)

The present embodiment is described with reference to FIGS. 1 to 4.

First, the outline of the method of manufacturing a light receiving device according to the present embodiment is described with reference to FIGS. 1 to 4.

The method of manufacturing a light receiving device 1 according to the present embodiment is a method of manufacturing a light receiving device 1 provided with a light receiving portion 11, a base substrate portion 12A in which this light receiving portion 11 is provided, and a transparent substrate portion 13A which is placed so as to face the base substrate portion 12A, where a resin layer 14 containing a photo curing resin is placed between the transparent substrate portion 13A and the base substrate portion 12A so as to surround the light receiving portion 11.

This method of manufacturing a light receiving device 1 includes:

providing a resin layer 14 containing a photo curing resin on a transparent substrate 13 where a plurality of transparent substrate portions 13A are integrated in such a manner that the resin layer covers the transparent substrate 13; selectively irradiating the resin layer 14 with light, followed by a developing process, so that the resin layer 14 remains in regions of the transparent substrate 13 which surround at least portions corresponding to the regions facing the light receiving portions 11 of the transparent substrate portions 13A; dividing the transparent substrate 13 into units of transparent substrate portions 13A so as to obtain a plurality of transparent substrate portions 13A; dividing the base substrate 12 into units of base substrate portions 12A so as to obtain a plurality of base substrate portions 12A; and joining the base substrate portion 12A and the transparent substrate portion 13A via the resin layer 14.

In the following, the configuration of the light receiving device 1 and the method of manufacturing a light receiving device 1 are described in detail.

The light receiving device 1 can be used as an image sensing device, concretely, a solid state image sensing device.

Figure 4:
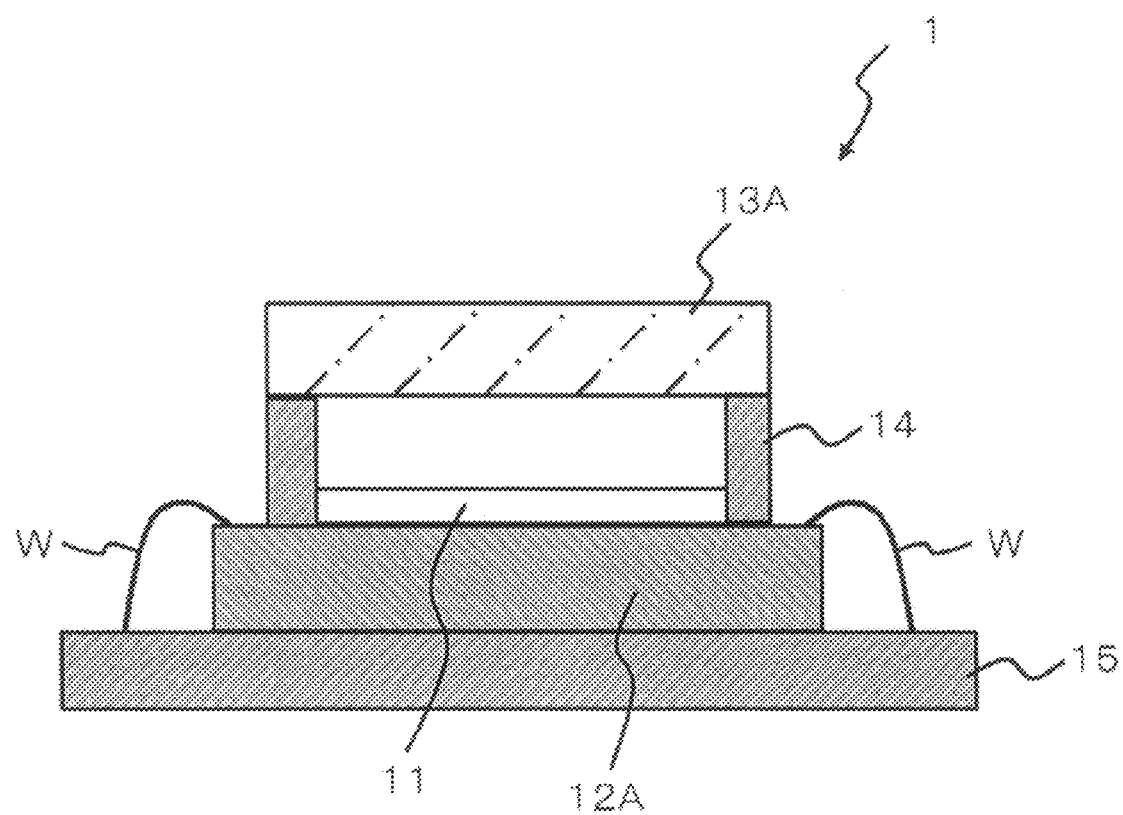
FIG. 4 is a cross sectional view showing a light receiving device according to the first embodiment.

The light receiving device 1 has, as shown in the cross sectional view of FIG. 4, a base substrate portion 12A where a micro lens array is formed, a transparent substrate portion 13A, a light receiving portion 11 formed of the micro lens array, a resin layer 14 formed so as to surround the light receiving portion 11, and a support substrate 15 on which the base substrate portion 12A is installed.

Here, FIG. 4 is a cross sectional view in the direction perpendicular to the base substrate portion 12A, the transparent substrate portion 13A and the substrate surface of the support substrate 15.

The base substrate portion 12A is, for example, a semiconductor substrate, and a micro lens array is formed on this base substrate portion 12A. The dimensions of this micro lens array in a plane are smaller than the dimensions of the base substrate portion 12A in a plane, and the outer periphery portion of the base substrate portion 12A protrudes to the outside from the micro lens array.

The transparent substrate portion 13A is placed so as to face the base substrate portion 12A and the light receiving portion 11 on the base substrate portion 12A, and has dimensions in a plane which are slightly smaller than the dimensions of the base substrate portion 12A in a plane. This transparent substrate portion 13A covers the light receiving portion 11 so as to protect the light receiving portion 11. The transparent substrate portion 13A is, for example, a glass substrate.

The resin layer 14 adheres directly to the base substrate portion 12A and the transparent substrate portion 13A so that the base substrate portion 12A and the transparent substrate portion 13A are joined. This resin layer 14 is placed so as to surround the light receiving portion 11 on the base substrate portion 12A and formed in a frame form. The location of the outer periphery portion of the resin layer 14 and the location of the outer periphery portion of the transparent substrate portion 13A approximately coincide.

A photoelectric conversion portion, not shown, is formed on the lower surface of the light receiving portion 11, that is to say, the base substrate portion 12A, so that light received by the light receiving portion 11 is converted to an electrical signal.

The support substrate 15 is a substrate where interconnects (not shown) are formed on the surface, and this support substrate 15 and the base substrate portion 12A are electrically connected through bonding wires W. Concretely, the outer periphery portion of the base substrate portion 12A which protrudes to the outside from the micro lens array and the support substrate 15 are connected through the bonding wires W. Accordingly, the bonding wires W are placed outside the resin layer 14.

Next, with reference to FIG. 1, the method of manufacturing a light receiving device 1 as such is described in detail.

First, as shown in FIG. 1(A), a transparent substrate 13 is prepared. This transparent substrate 13 is a large scale glass plate material where a plurality of transparent substrate portions 13A are integrated.

Next, an adhesive resin layer 14 is provided on this transparent substrate 13 so as to cover approximately the entirety of the surface of the transparent substrate 13.

This adhesive resin layer 14 is a photo curing adhesive film according to the present embodiment. An adhesive film is pasted to the transparent substrate 13 according to the present embodiment.

Here, the configuration of the adhesive film is described.

The adhesive film is formed of a resin composition including a photo curing resin and a filler, and it is preferable for the moisture permeability to be 30 [$g/m^2 \cdot 24$ h] or higher when measured in accordance with the JIS Z0208 B method.

It is preferable for the moisture permeability of the adhesive film to be 40 [$g/m^2 \cdot 24$ h] or higher, and preferably 50 [$g/m^2 \cdot 24$ h] to 200 [$g/m^2 \cdot 24$ h]. In the case where the moisture permeability is less than the lower limit value, condensation sometimes cannot be sufficiently prevented in the transparent substrate portion 13A and the like of the light receiving device 1. In the case where the moisture permeability exceeds the upper limit value, the film forming properties of the adhesive film sometimes become inferior. The moisture permeability can be evaluated at 40° C./90% following the water vapor permeability cup method (JIS Z0208 B method) using an adhesive film having a thickness of 100 μm.

As the photo curing resin, ultra violet ray curing resins of which the main component is an acryl based compound, ultra violet ray curing resins of which the main component is urethane acrylate oligomer or polyester urethane acrylate oligomer, and ultra violet ray curing resins of which the main component is at least one type selected from the group consisting of epoxy based resins and vinyl phenol based resins can be cited as examples.

From among these, ultra violet ray curing resins of which the main component is an acryl based compound are preferable. The rate of curing when irradiated with light is fast in acryl based compounds, and thus, the resin can be patterned with a relatively small amount of exposure to light.

As the acryl based compound, acrylic ester monomers and methacrylic ester monomers can be cited, and concretely, bifunctional acrylates such as ethylene glycol diacrylate, ethylene glycol dimethacrylate, 1,6-hexanediol diacrylate, 1,6-hexanediol dimethacrylate, glycerin diacrylate, glycerin dimethacrylate, 1,10-decanediol diacrylate and 1,10-decanediol dimethacrylate, multifunctional acrylates such as trimethylolpropane triacrylate, trimethylolpropane trimethacrylate, pentaerythritol triacrylate, pentaerythritol trimethacrylate, dipentaerythrytol hexaacrylate and dipentaerythrytol hexamethacrylate, can be cited. From among these, acrylic ester is preferable, and acrylic ester or methacrylic alkyl ester of which the carbon number in the ester portion is 1 to 15 is particularly preferable.

Though the content of the photo curing resin (ultra violet ray curing resin) is not particularly limited, the content is preferably 5 weight % to 60 weight % of the total of the resin composition forming the adhesive film, and more preferably 8 weight % to 30 weight %. In the case where the content is less than the lower limit value, the adhesive film sometimes cannot be patterned through irradiation with ultra violet rays, while in the case where the content exceeds the upper limit value, the resin becomes too soft and the sheet properties before irradiation with ultra violet rays sometimes become inferior.

Furthermore, it is preferable for the adhesive film to contain a photopolymerization initiator.

As a result, the adhesive film can be efficiently patterned through photopolymerization.

As the photopolymerization initiator, benzophenone, acetophenone, benzoin, benzoin isobutyl ether, benzoin methyl benzoate, benzoin benzoate, benzoin methyl ether, benzyl phenyl sulfide, benzyl, dibenzyl and diacetyl can be cited as examples.

Though the content of the photopolymerization initiator is not particularly limited, the content is preferably 0.5 weight % to 5 weight % of the total of the resin composition, and more preferably 0.8 weight % to 2.5 weight %. In the case where the content is less than the lower limit value, the effects of initiating photopolymerization sometimes deteriorate, while in the case where the content exceeds the upper limit value, the reactivity becomes too high and the preservability and resolution sometimes lower.

Furthermore, it is preferable for the adhesive film to additionally include a thermosetting resin.

As the thermosetting resin, novolac type phenolic resins such as phenyl novolac resins, cresol novolac resins and bisphenol A novolac resins, phenolic resins such as resol phenolic resin, bisphenol type epoxy resins such as bisphenol A epoxy resins and bisphenol F epoxy resins, novolac type epoxy resins such as novolac epoxy resins and cresol novolac epoxy resins, epoxy resins such as biphenyl type epoxy resins, stilbene type epoxy resins, triphenol methane type epoxy resins, alkyl modified triphenol methane type epoxy resins, triazine nucleus-containing epoxy resins and dicyclopentadiene modified phenol type epoxy resins, resins having a triazine ring such as urea resins and melamine resins, unsaturated polyester resins, bismaleimide resins, polyurethane resins, diallyl phthalate resins, silicone resins, resins having a benzooxazine ring and cyanate ester resins can be cited as examples, and these may be used alone or mixed for use. From among these, epoxy resins are particularly preferable. As a result, the resistance to heat and adhesiveness can further be increased.

In addition, it is preferable to use both an epoxy resin which is solid at room temperature (particularly a bisphenol type epoxy resin) and an epoxy resin which is liquid at room temperature (particularly a silicone modified epoxy resin which is liquid at room temperature) as the epoxy resin. As a result, an adhesive film having both excellent flexibility and resolution can be provided while maintaining the resistance to heat.

Though the content of the thermosetting resin is not particularly limited, the content is preferably 10 weight % to 40 weight % of the total of the resin composition forming the adhesive film, and more preferably 15 weight % to 35 weight %. In the case where the content is less than the lower limit value, the effects of increasing the resistance to heat sometimes deteriorate, while in the case where the content exceeds the upper limit value, the effects of increasing the toughness of the adhesive film sometimes deteriorate.

Furthermore, it is preferable for the adhesive film to include a curing resin which can be cured both by light and heat. As a result, compatibility between the photocuring resin and the thermosetting resin can be increased, and as a result, the strength of the adhesive film after curing (photo curing and thermosetting) can be increased.

As the curing resin which can be cured both by light and heat, thermosetting resins having a photoreactive group such as an acryloyl group, a methacryloyl group or a vinyl group, and photo curing resins having a heat reactive group such as an epoxy group, a phenolic hydroxide group, an alcoholic hydroxide group, a carboxylic group, acid anhydride, an amino group and a cyanate group can be cited as examples. Concretely, (meth) acrylic modified phenolic resins, acryl copolymer resins having a carboxylic group and an acryl group in a side chain, and a (meth)acryloyl group-containing (meth)acrylate polymer can be cited. From among these, (meth)acrylic modified phenolic resins are preferable. As a result, an alkali solution which places little burden on the environment can be used as a developer instead of an organic solvent, and at the same time, the resistance to heat can be maintained.

In the case of a thermosetting resin having the photo reactive group, though the modification ratio (substitution ratio) of the photo reactive group is not particularly limited, the modification ratio is preferably 20% to 80% of the total of the reactive group in the curing resin which can be cured both by light and heat (total of photo reactive group and heat reactive group), and more preferably 30% to 70%. In the case where the amount of modification is within the range, the resolution is particularly excellent.

In the case of a photo curing resin having the heat reactive group, though the modification ratio (substitution ratio) of the heat reactive group is not particularly limited, the modification ratio is preferably 20% to 80% of the total of the reactive group in the curing resin which can be cured both by light and heat (total of photo reactive group and heat reactive group), and more preferable 30% to 70%. In the case where the amount of modification is within the range, the resolution is particularly excellent.

Though the content of the curing resin which can be cured both by light and heat is not particularly limited, the content is preferably 15 weight % to 50 weight % of the total of the resin composition forming the adhesive film, and more preferably 20 weight % to 40 weight %. In the case where the content is less than the lower limit value, the effects of increasing the compatibility sometimes deteriorate, while in the case where the content exceeds the upper limit value, the developing properties and resolution sometimes become inferior.

It is preferable for the adhesive film to include a filler. A filler is an important component which makes it possible to control the moisture permeability of the adhesive film.

As the filler, fillers in fiber form such as alumina fibers and glass fibers, fillers in needle form such as potassium titanate, wollastonite, aluminum borate, magnesium hydroxide in needle form and whiskers, fillers in plate form such as talc, mica, sericite, glass flakes, graphite in scale form and calcium carbonate in plate form, fillers in spherical form (granular form) such as calcium carbonate, silica, melted silica, sintered clay and clay which is not sintered, and porous fillers such as zeolite and silica gel, can be cited as examples. One or more types of these fillers may be mixed for use. From among these, porous fillers are preferable. As a result, the moisture permeability of the adhesive film can be increased.

Though the average particle diameter of the filler is not particularly limited, the diameter is preferably 0.01 μm to 90 μm, and more preferably 0.1 μm to 40 μm. In the case where the average particle diameter exceeds the upper limit value, the appearance of the film sometimes becomes abnormal, or the resolution becomes poor, while in the case where the average particle diameter is less than the lower limit value, adhesion sometimes becomes poor at the time of pasting through application of heat.

The average particle diameter can be measured using, for example, a laser diffraction type particle size distribution measuring apparatus SALD-7000 (made by Shimadzu Corporation).

Though the content of the filler is not particularly limited, the content is preferably 5 weight % to 70 weight % of the total of the resin composition which forms the adhesive film, and more preferably 20 weight % to 50 weight %. In the case where the content exceeds the upper limit value, the adhesion sometimes becomes poor at the time of pasting through application of heat, while in the case where the content is less than the lower limit value, the moisture permeability sometimes becomes low, so that the substrate cannot be improved in terms of condensation.

It is preferable to use a porous filler as the filler. In the case where a porous filler is used as the filler, the average pore diameter of the porous filler is preferably 0.1 nm to 5 nm, and more preferably 0.3 nm to 1 nm. In the case where the average pore diameter exceeds the upper limit value, there is a possibility that the resin component may partially enter into the pores, hampering reaction, while in the case where the average pore diameter is less than the lower limit value, the water absorbing performance lowers, and therefore, the moisture permeability of the adhesive film sometimes lowers.

As concrete examples of the porous filler, molecular sieves made of crystalline zeolite can be cited. Crystalline zeolite can be represented by the following general formula.

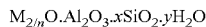

$M_{2/n}O \cdot Al_2O_3 \cdot xSiO_2 \cdot yH_2O$

M: metal cation n: valence

As the crystal type of the crystal zeolite, 3A, 4A, 5A and 13X can be cited, and type 3A and type 4A is preferable for use, from the point of view of effectively preventing condensation.

Though the force of adsorption [Q1] of the filler at room temperature is not particularly limited, the force is preferably 7 [g/100 g of filler] or more, and more preferably 15 [g/100 g of filler] or more. In the case where the force of adsorption at room temperature is less than the lower limit value, the water absorbing performance of the filler lowers and the moisture permeability of the adhesive film sometimes lowers.

The force of adsorption [Q1] at room temperature can be obtained by measuring the increase in weight of the filler that has been completely dried through application of heat in an aluminum cup and has been left in an environment of 25° C./50% for 168 hours.

Furthermore, though the force of adsorption [Q2] of the filler at 60° C. is not particularly limited, the force is preferably 3 [g/100 g of filler] or more, and more preferably 10 [g/100 g of filler] or more. When the force of adsorption maintains the value even at the temperature of 60° C., there are some effects of improving the light receiving device 1 in terms of condensation.

The force of adsorption [Q2] at 60° C. can be obtained by measuring the increase in weight of the filler that has been completely dried through application of heat in an aluminum cup and has been left in an environment of 60° C./90% for 168 hours.

Though the relationship between the force of adsorption [Q1] at room temperature and the force of adsorption [Q2] at 60° C. is not particularly limited, it is preferable for the relationship to satisfy the following relationship.

$$0.4 \times [Q1] < [Q2]$$

In the case where [Q1] and [Q2] satisfy the above relationship formula, there are particular effects of improving the inside of the light receiving device 1 in terms of condensation.

This is because the filler maintains the force of adsorption even at high temperatures, and therefore, films filled with this filler maintain a high moisture permeability even at a relatively high temperatures, making it easy for moisture in gas form to permeate through the adhesive film. And therefore, moisture is instantly reduced on the inside of the light receiving device 1 when the temperature is lowered from a high temperature to room temperature, and thus, there is no phenomenon of condensation.

The resin composition forming the adhesive film may contain such additives as a plastic resin, a leveling agent, a defoaming agent or a coupling agent in addition to the curing resin and filler as described above, as long as the object of the present invention can be achieved.

In addition, it is preferable for the adhesive film to have adhesiveness to such a degree as not to peel from the transparent substrate 13 at the time of the dicing which will be described below.

Next, a photo mask is used to selectively irradiate the adhesive film with light. As a result, portions of the adhesive film which are irradiated with light are photo-cured. The adhesive film is developed in a developer (for example an alkaline solution, an organic solvent or the like) after being exposed to light. Portions which are not irradiated with light dissolve in the developer and are removed, and at the same time, the portions which are irradiated with light do not dissolve in the developer and remain. According to the present embodiment, the adhesive film remains in regions of the transparent substrate 13 other than portions R corresponding to the regions facing the light receiving portions 11 of the transparent substrate portions 13A (see FIG. 1(B)). Concretely, as shown in the plan view of FIG. 2, the adhesive film remains in grid form so as to surround the portions R corresponding to regions of the transparent substrate portions 13A facing the light receiving portions 11.

After that, the transparent substrate 13 is diced and a plurality of transparent substrate portions 13A are obtained. According to the present embodiment, the adhesive film is provided so as to surround the portions R corresponding to the regions facing the light receiving portions 11, and therefore, when the transparent substrate 13 is diced, the adhesive film is also diced (see dicing lines A in FIG. 1(B)).

As a result, as shown in FIG. 1(C), transparent substrate portions 13A in which a resin layer 14 in frame form is provided can be obtained.

Next, base substrate portions 12A in which light receiving portions 11 formed of a micro lens array are provided are prepared.

Figure 3:
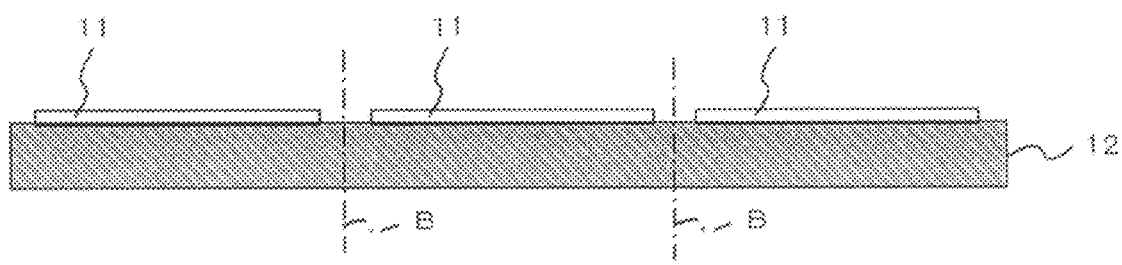
FIG. 3 is a view showing a light receiving device during the manufacturing process.

Concretely, as shown in FIG. 3, a base substrate 12 where a plurality of base substrates portions 12A are integrated is prepared.

Next, a plurality of micro lens arrays are formed on the base substrate 12 at predetermined intervals.

After that, the base substrate 12 is diced into units of micro lens arrays (units of light receiving portions) (see dicing lines B in FIG. 3). As a result, base substrate portions 12A in which a light receiving portion 11 is provided are obtained.

Next, these base substrate portion 12A and the transparent substrate portion 13A are placed so as to face each other, and thus positioned. At this time, a resin layer 14 is placed between the base substrate portion 12A and the transparent substrate portion 13A.

Then, pressure is applied to the base substrate portion 12A and the transparent substrate portion 13A, or pressed against each other through application of heat. As a result, the base substrate portion 12A and the transparent substrate portion 13A are pasted via the resin layer 14.

Furthermore, each base substrate portion 12A and transparent substrate portion 13A, which are pasted through the resin layer 14, is installed on a support substrate 15, and interconnects on the support substrate 15 and the base substrate portion 12A are electrically connected through bonding wires W.

Through the above processes, light receiving devices 1 can be obtained.

Next, the working effects of the present embodiment are described.

According to the present embodiment, the base substrate 12 and the transparent substrate 13 are respectively divided, and after that, the base substrate portion 12A and the transparent substrate portion 13A are joined. Therefore, in the manufacturing process for the light receiving devices 1, the base substrate portion 12A and the transparent substrate portion 13A can be positioned with precision, and thus, the transparent substrate portions and the base substrate portions can be prevented from shifting in position in a great number of light receiving devices at the same time, unlike in the conventional art. As a result, the yield in the manufacture can be increased.

In addition, the base substrate 12 and the transparent substrate 13 are respectively divided, and after that, the portions are joined, and therefore, the transparent substrate portion 13A can be prevented from being damaged at the time of dicing of the base substrate 12. As a result, the yield in the manufacture can be increased.

In addition, according to the present embodiment, the resin layer 14 (adhesive film) is formed of a resin composition including a photo curing resin and a filler, and has a moisture permeability of 30 [$g/m^2 \cdot 24$ h] or higher when measured in accordance with the JIS Z0208 B method. Thus, air permeability can be secured between the inner space surrounded by the resin layer 14 of the light receiving device 1 and the outer space outside the resin layer 14. As a result, condensation can be prevented in the transparent substrate portions 13A and the base substrate portions 12A from occurring.

In addition, the curing rate of acryl based compounds is high when irradiated with light. Accordingly, in the case where the adhesive film includes an acryl based compound, the adhesive film can be exposed to a relatively small amount of light.

Furthermore, when the adhesive film includes a thermosetting resin, the base substrate portions 12A and the transparent substrate portions 13A can be pasted without failure through thermosetting after the adhesive film is exposed to light and patterned.

In addition, when the thermosetting resin is an epoxy resin, the resistance to heat of the resin layer 14 in the light receiving devices 1 can be increased, and at the same time, the adhesiveness between the resin layer 14 and the base substrate portions 12A and between the resin layer 14 and the transparent substrate portions 13A can be increased.

Furthermore, when the adhesive film includes a curing resin which can be cured both by light and heat, the compatibility between the photo curing resin and the thermosetting resin can be increased, and as a result, the strength of the adhesive film after curing (photo curing and thermosetting) can be increased.

(Second Embodiment)

Figure 5:
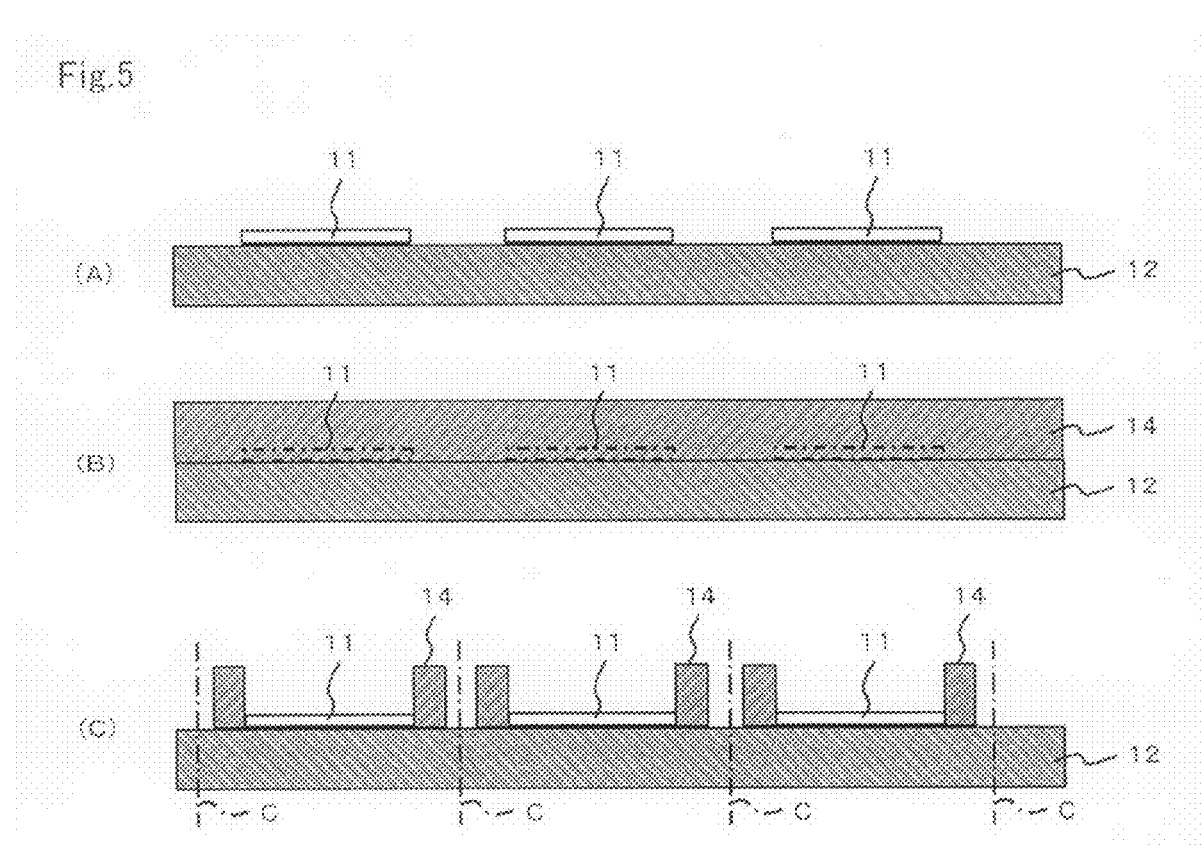
FIG. 5 are views showing a light receiving device during the manufacturing process according of the second embodiment.

The method of manufacturing a light receiving device 1 according to the present embodiment is described with reference to FIG. 5.

The method of manufacturing a light receiving device 1 according to the present embodiment includes:

pasting a resin layer 14 containing a photo curing resin on a base substrate 12 on which a plurality of light receiving portions 11 are provided and where a plurality of base substrate portions 12A are integrated so as to cover the base substrate 12; selectively irradiating the resin layer 14 with light, followed by development, so that the resin layer 14 remains in regions which surround at least the respective light receiving portions 11 on the base substrate 12; dividing the base substrate 12 into units of base substrate portions 12A so that a plurality of base substrates 12A are obtained; dividing the transparent substrate 13 into units of regions which cover a plurality of light receiving portions 11 so that a plurality of transparent substrate portions 13A are obtained; and joining the base substrate portion 12A and the transparent substrate portion 13A via the resin layer 14, which is provided so as to surround the light receiving portions 11.

The present embodiment is different from the above-described embodiment in that an adhesive film (resin layer 14) is pasted to the transparent substrate 13 in the above-described embodiment, while an adhesive film is pasted to the base substrate 12 in the present embodiment (see FIGS. 5(A) and 5(B)). Other points are the same as in the above-described embodiment.

The adhesive film is pasted so as to integrally cover the plurality of light receiving portions 11 on the base substrate 12.

Figure 6:
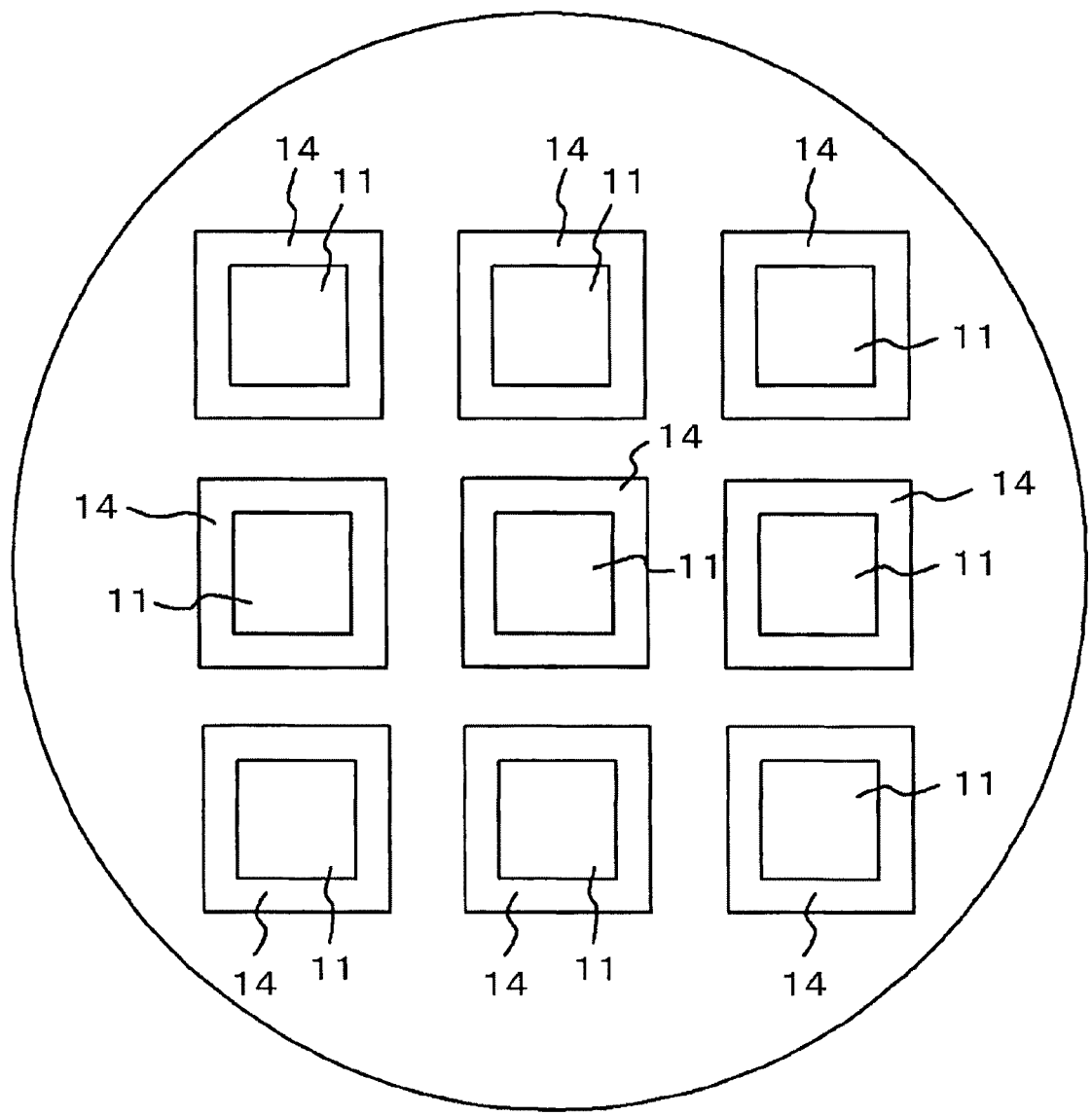
FIG. 6 is a plan view showing the state when a resin layer is provided on a base substrate.

In addition, the adhesive film is selectively irradiated with light and portions which are not irradiated are removed through a developing process so that the adhesive film remains in regions other than the respective light receiving portions 11 on the base substrate 12 (see FIG. 5(C)). Here, as shown in FIG. 6, the adhesive film remains in a plurality of portions in frame form so as to surround the respective light receiving portions 11. After that, the base substrate 12 is diced into units of respective light receiving portions 11. The adhesive film is not diced when the base substrate 12 is diced (see dicing lines C in FIG. 5(C)).

Here, it is preferable for the adhesive film to have adhesiveness to such a degree as not to peel from the base substrate 12 at the time of dicing.

After that, the transparent substrate 13 is divided into units of regions which cover the plurality of light receiving portions 11.

Then, the transparent substrate portion 13A and the base substrate portion 12A are pasted together via the resin layer 14 in frame form. Thus, light receiving devices 1 which are the same as those in the above-described embodiment can be obtained.

According to the present embodiment, the same effects as in the above-described embodiment can be obtained, and in addition, the following effects can also be obtained.

According to a configuration of the present embodiment, the adhesive film is not diced when the base substrate 12 is diced. Therefore, the adhesive film can be prevented from peeling at the time of dicing of the base substrate 12.

(Third Embodiment)

Figure 7:
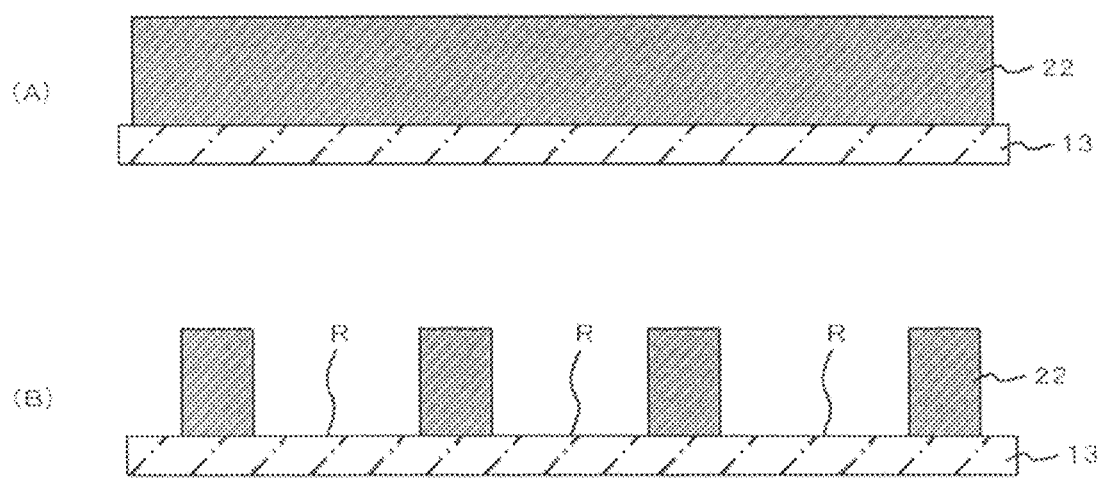
FIG. 7 are views showing a light receiving device during the manufacturing process according to the third embodiment.
Figure 8:
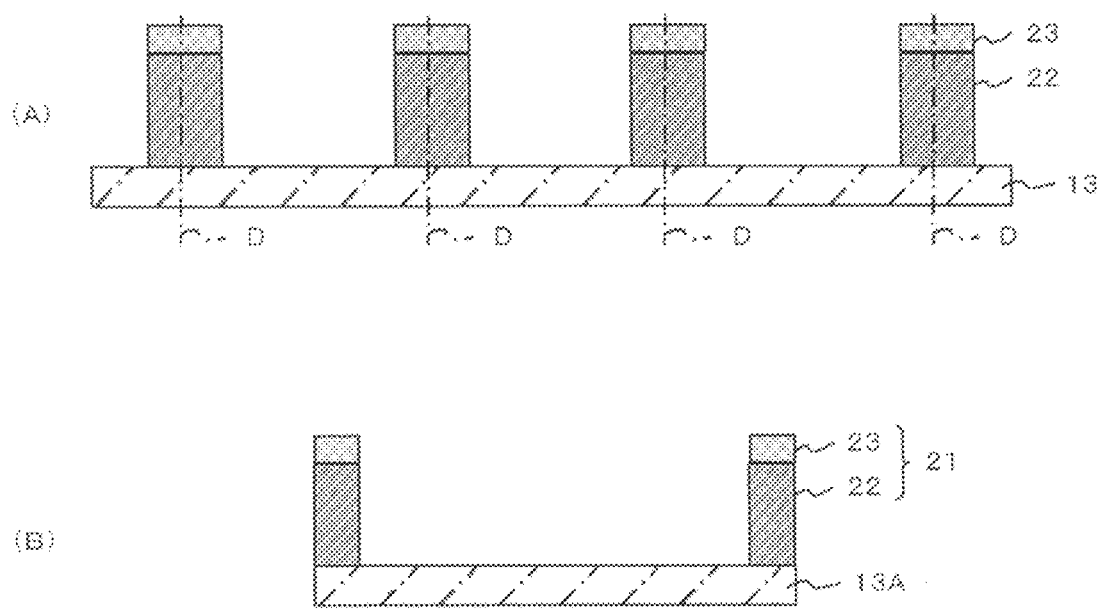
FIG. 8 are views showing a light receiving device during the manufacturing process according to the third embodiment.

The method of manufacturing a light receiving device 2 according to the present embodiment is described with reference to FIGS. 7 to 9.

The method of manufacturing a light receiving device 2 according to the present embodiment is a method of manufacturing a light receiving device 2 which is provided with a support substrate 15 on which a light receiving element 20 having a light receiving portion 11 and a base substrate portion 12A in which this light receiving portion 11 is provided is installed and a transparent substrate portion 13A which is placed so as to face the surface of the support substrate 15 on which the light receiving element 20 is provided, where a resin layer 22 containing a photo curing resin is placed between the support substrate 15 and the transparent substrate portion 13A so as to surround the light receiving element 20.

The method of manufacturing a light receiving device 2 includes:

providing a photo curing resin layer 22 on the transparent substrate 13 where a plurality of the transparent substrate portions 13A are integrated so as to cover the transparent substrate 13;

selectively irradiating the resin layer 22 with light, followed by a developing process, so that the resin layer 22 remains so as to surround portions of the transparent substrate 13 corresponding to regions facing light receiving elements 20 of the transparent substrate portions 13A;

dividing the transparent substrate 13 into units of respective transparent substrate portions 13A; and joining support substrates 15 and the transparent substrate portions 13A via the resin layer 22 after the light receiving elements 20 are installed on the support substrates 15.

In the following, the configuration of the light receiving device 2 and the method of manufacturing the light receiving device 2 are described in detail.

Figure 9:
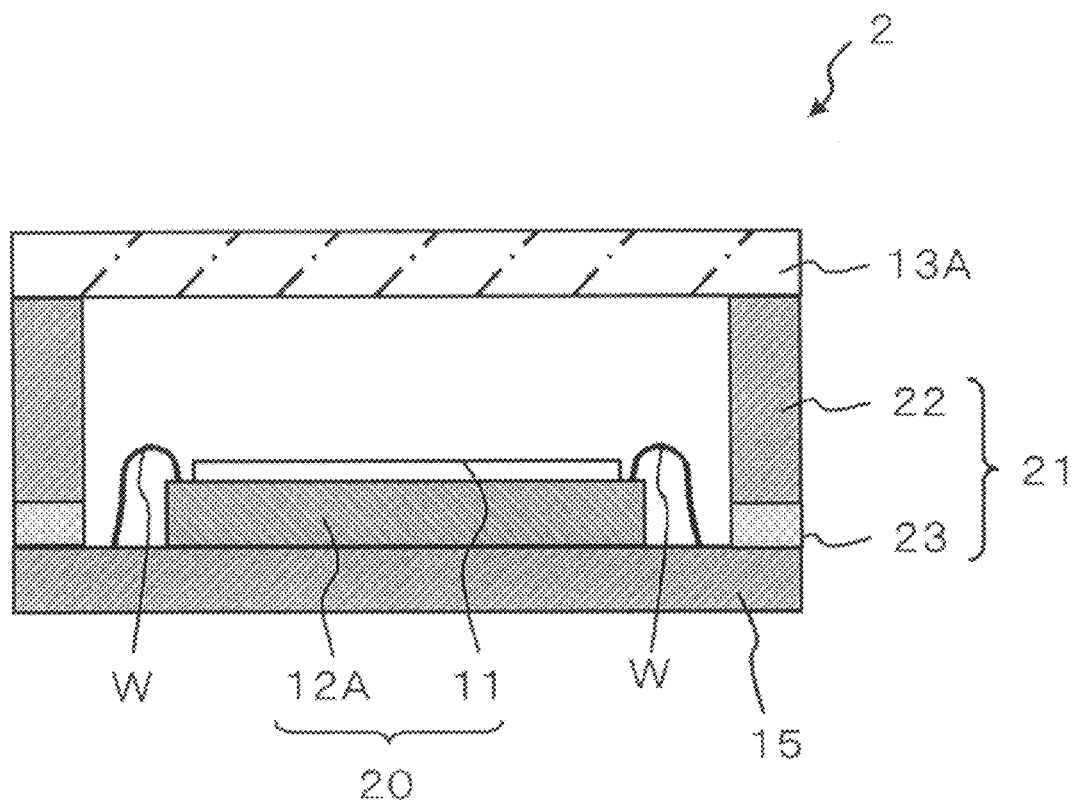
FIG. 9 is a cross sectional view showing a light receiving device according to the third embodiment.
Figure 10:
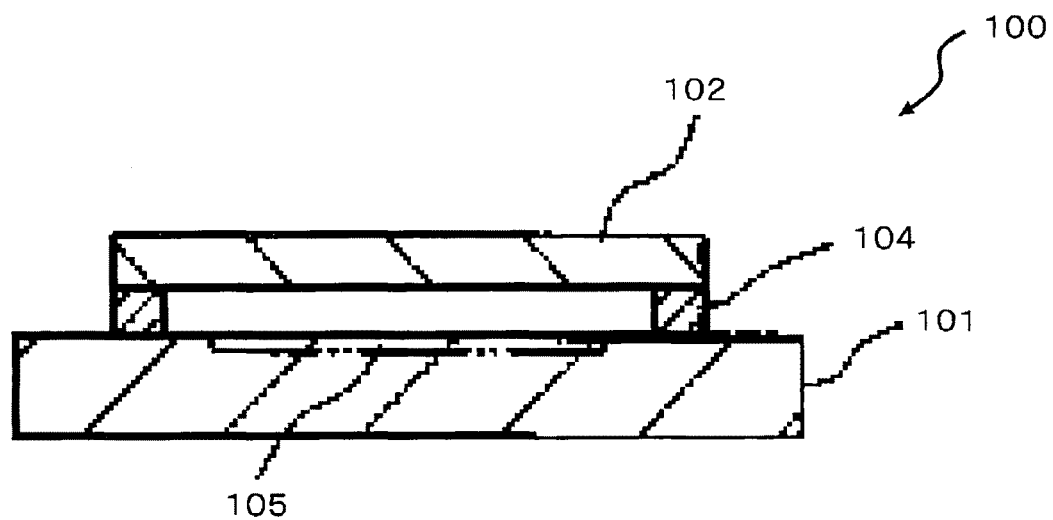
FIG. 10 is a cross sectional view showing a conventional solid state image sensing device.
Figure 11:
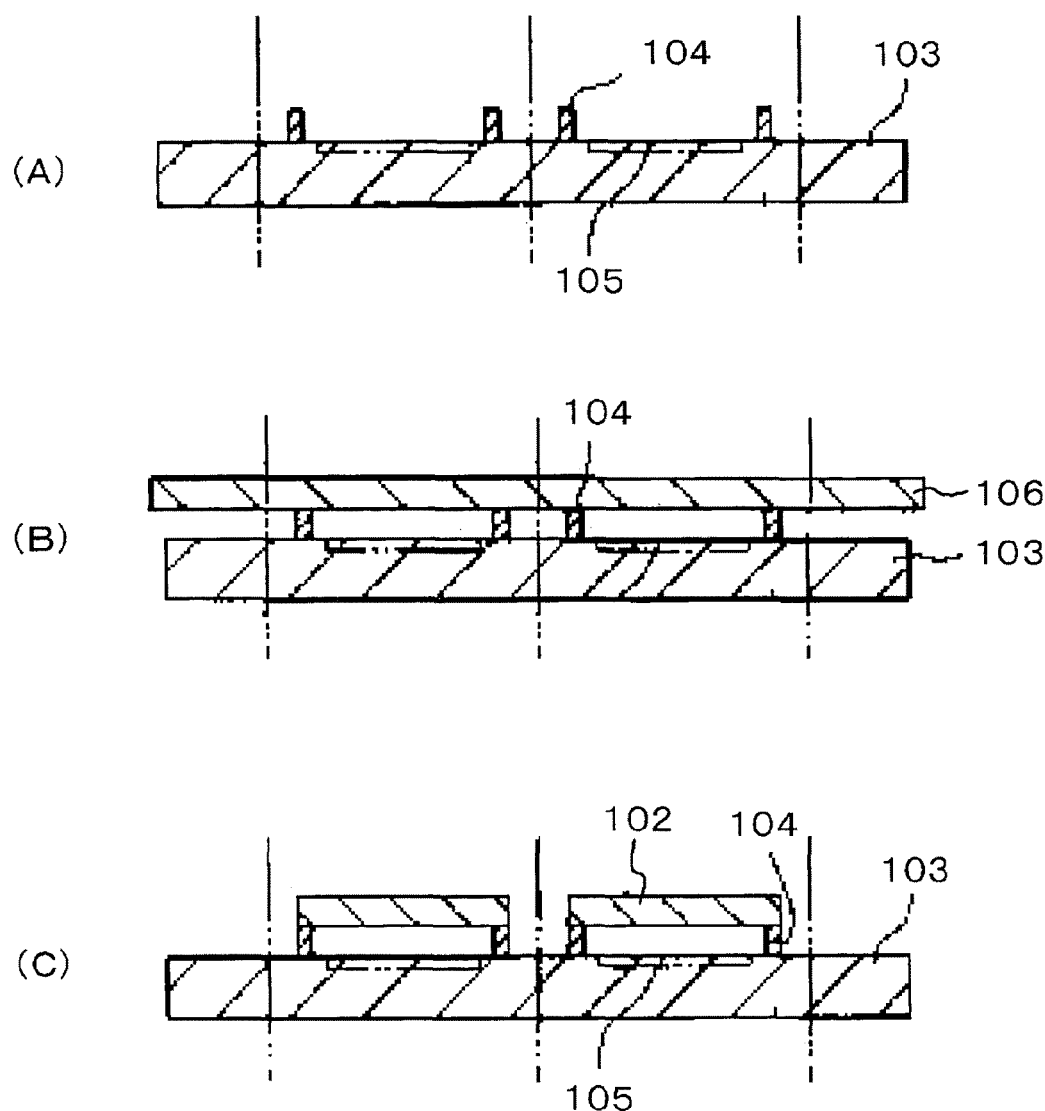
FIG. 11 are views showing a conventional manufacturing process for a solid state image sensing device.

As shown in the cross sectional view of FIG. 9, the light receiving device 2 has a light receiving element 20 having a micro lens array which becomes a light receiving portion 11 and a base substrate portion 12A in which this micro lens array is installed.

The light receiving element 20 is installed on a support substrate 15 which is the same as that in the above-described embodiment.

In addition, the light receiving device 2 has a transparent substrate portion 13A. This transparent substrate portion 13A is placed so as to face the support substrate 15 and covers the light receiving element 20 on the support substrate 15.

The transparent substrate portion 13A and the support substrate 15 are connected via a frame portion 21.

This frame portion 21 is arranged so as to surround the light receiving element 20 on the support substrate 15. The frame portion 21 is provided with a photo curing resin layer 22 formed in frame form and an adhesive layer 23 in frame form. The resin layer 22 makes direct contact with the transparent substrate portion 13A, and in addition, the adhesive layer 23 makes direct contact with both the resin layer 22 and the support substrate 15.

The total height of the resin layer 22 and the adhesive layer 23 is greater than the height of the light receiving element 20, and a space is created between the light receiving element 20 and the transparent substrate portion 13A.

Here, the support substrate 15 and the base substrate portion 12A are electrically connected through bonding wires W in the light receiving device 2. The frame portion 21 is provided so as to surround the outer periphery of these bonding wires W.

Next, a method of manufacturing this light receiving device 2 is described in detail with reference to FIGS. 7 and 8.

First, as shown in FIG. 7(A), a transparent substrate 13 is prepared. This transparent substrate 13 is a large scale glass plate material where a plurality of transparent substrate portions 13A are integrated.

Next, a resin layer 22 is provided on this transparent substrate 13 so as to cover approximately the entirety of the surface of the transparent substrate 13.

This resin layer 22 is a layer containing a photo curing resin and here is in paste form (varnish form). The resin layer 22 is coated on the surface of the transparent substrate 13. As the method for coating, spin coating using a spinner, spraying coating using a spray coater, dipping, printing and roll coating can be cited as examples.

Here, the resin layer 22 is described.

The resin layer 22 contains a cyclic olefin resin.

As cyclic olefin monomers, general monocyclic substances such as cyclohexene and cyclooctene, and polycyclic substances such as norbornene, norbornadiene, dicyclopentadiene, dihydrodicyclopentadiene, tetracyclododecane, tricyclopentadiene, dihydrotricyclopentadiene, tetracyclopentadiene and dihydrotetracyclopentadiene, can be cited. Substituted substances where a functional group is linked to one of these monomers can also be used.

As the cyclic olefin resin, polymers of the cyclic olefin monomers can be cited. Here, as the polymerization method, publicly known methods such as random polymerization and block polymerization, can be used.

It is possible to manufacture cyclic olefin resins in accordance with a publicly known polymerization method, and as the polymerization method, there are additional polymerization methods and ring opening polymerization methods. From among these, polymers obtained through additional (co)polymerization of a norbornene monomer are preferable. In the case where a norbornene resin is used in the resin layer 22, an advantage such that the stability in the manufacture is excellent so that patterning becomes highly precise at the time of manufacture of the light receiving device 2 can be obtained.

As additional polymers of cyclic olefin resins, (1) additional (co)polymers of norbornene types monomers obtained through additional (co)polymerization of norbornene type monomers, and (2) additional copolymers of a norbornene type monomer, a disconjugate diene and another monomer, if necessary, can be cited. These resins can be obtained in accordance with any publicly known polymerization method.

Though from among the above, (1) additional (co)polymers of norbornene types monomers obtained through additional (co)polymerization of norbornene type monomers are preferable, the present invention is not limited to any of these.

It is preferable for the cyclic olefin resin to include a reactive functional group. Concrete examples of reactive functional groups are epoxy groups such as a glycidyl ether group, an oxetane group, a carboxylic group, a hydroxyl group, unsaturated bonds, an amino group and the like. From among these, epoxy groups are particularly preferable.

A cyclic olefin resin having an epoxy group can generally be obtained by directly polymerizing a monomer which includes an epoxy group in the molecule, and the same type of polymer can be obtained in accordance with a method of introducing an epoxy group into a side chain through a modification reaction after polymerization. As the modification reaction, there are publicly known methods such as graft reaction of an epoxy group-containing unsaturated monomer with the above polymer, reaction of a compound having an epoxy group with a reactive functional group site of the above polymer, and direct conversion of the above polymer having a double bond of carbon-carbon in the molecule to epoxy using an epoxidizing agent such as a peroxide or hydroperoxide.

Additional polymers of cyclic olefin resins can be obtained through coordination polymerization using a metal catalyst or radical polymerization. From among these, in coordination polymerization, a polymer is obtained through polymerization of a monomer in a solution in the presence of a transition metal catalyst (NiCOLE R. GROVE et al. Journal of Polymer Science: Part B, Polymer Physics, Vol. 37, 3003-3010 (1999)).

Nickel and platinum catalysts, which are typical metal catalysts used for coordination polymerization, are described in PCT WO 9733198 and PCT WO 00/20472. As metal catalysts for coordination polymerization, publicly known metal catalysts such as (toluene)bis(perfluorophenyl)nickel, (methylene)bis(perfluorophenyl)nickel, (benzene)bis(perfluorophenyl)nickel, bis(tetra hydro)bis(perfluorophenyl)nickel, bis(ethyl acetate)bis(perfluorophenyl)nickel and bis(dioxane)bis(perfluorophenyl)nickel can be cited as examples.

The radical polymerization technology is described in Encyclopedia of Polymer Science, John Wiley & Sons, 13, 708 (1988).

In general radical polymerization, a monomer reacts in a solution in the presence of a radical initiator when the temperature is increased to 50° C. to 150° C. As the radical initiator, azobisisobutyl nitrile (AIBN), benzoyl peroxide, lauryl peroxide, azobisisocaptonitrile, azobisisoleronitrile and t-butyl hydrogen peroxide can be cited.

The molecular weight of the cyclic olefin resin can be controlled by changing the ratio of the initiator to the monomer or changing the time for polymerization. In the case where a resin for coordination polymerization is used as described above, the molecular weight can be controlled using a chain transfer catalyst, as disclosed in U.S. Pat. No. 6,136,499. According to this invention, α-olefins such as ethylene, propylene, 1-hexane, 1-decene and 4-methyl-1-pentene are appropriate for controlling the molecular weight.

The weigh average molecular weight of the cyclic olefin resin is 10,000 to 500,000, preferably 80,000 to 200,000 and more preferably 100,000 to 125,000. The weight average molecular weight can be measured through gel permeation chromatography (GPC) using a standard polynorbornene (following ASTMDS 3536-91).

In addition, as the cyclic olefin monomer used for the manufacture of a cyclic olefin resin having an epoxy group, norbornene type monomers which can be represented by the general formula (1) are preferable.

As concrete examples of alkyl groups, a methyl group, an ethyl group, a propyl group, an isopropyl group, a butyl group, a pentyl group, a hexyl group, a heptyl group, an octyl group, a nonyl group, a decyl group, a dodecyl group, a cyclopentyl group, a cyclohexyl group and a cyclooctyl group can be cited, as concrete examples of alkenyl groups, a vinyl group, an allyl group and a butynyl group, as concrete examples of alkynyl groups, an ethynyl group, a 1-propynyl group, a 2-propynyl group, a 1-butynyl group and a 2-butynyl group can be cited, as concrete examples of aryl groups, a phenyl group, a naphthyl group and an anthracenyl group can be cited, and as concrete examples of aralkyl groups, a benzyl group and a phenetyl group can be cited, but the invention is not limited to these.

The structure of functional groups containing an ester group, functional groups containing a ketone group and functional groups containing an ether group is not particularly limited, as long as these are functional groups containing these groups. As a preferable concrete example of a functional group containing an epoxy group, a functional group having a glycidyl ether group can be cited, but the structure is not particularly limited, as long as it is a functional group having an epoxy group.

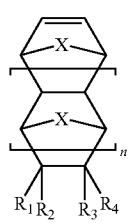

(1)

[In Formula (1), X is any of O, $CH_2$ or $(CH_2)_2$, and n is an integer of 0 to 5. $R_1$ to $R_4$ are any of hydrogen, an alkyl group, an alkenyl group, an alkynyl group, an allyl group, an aryl group, an aralkyl group, a functional group containing an ester group, a functional group containing a ketone group, a functional group containing an ether group or a functional group containing an epoxy group.]

As the cyclic olefin monomer used for the manufacture of a cyclic olefin resin, 5-methyl-2-norbornene, 5-ethyl-2-norbornene, 5-butyl-2-norbornene, 5-hexyl-2-norbornene and 5-decyl-2-norbornene can be cited as examples of monomers having an alkyl group, 5-allyl-2-norbornene, 5-methylydene-2-norbornene, 5-(2-propenyl)-2-norbornene and 5-(1-methyl-4-pentenyl)-2-norbornene can be cited as examples of monomers having an alkenyl group, 5-ethynyl-2-norbornene can be cited as an example of a monomer having an alkynyl group, dimethylbis((5-norbornene-2-yl)methoxy)silane can be cited as an example of a monomer having an alkoxysilyl group, 1,1,3,3,5,5-hexamethyl-1,5-dimethylbis(2-(5-norbornene-2-yl)ethyl)trisiloxane can be cited as an example of a monomer having a silyl group, 5-phenyl-2-norbornene and 5-pentafluorophenyl-2-norbornene can be cited as examples of monomers having an aryl group, 5-benzyl-2-norbornene and 5-phenetyl-2-norbornene can be cited as examples of monomers having an aralkyl group, 5-trimethoxysilyl-2-norbornene and 5-(3-trimethoxypropyl)-2-norbornene can be cited as examples of monomers having an alkoxysilyl group, 5-norbornene-2-methanol and an alkyl ether of this, 5-norbornene-2-methyl acetate, 5-norbornene-2-methyl caprate, 5-norbornene-2-t-butyl carboxylate, 5-norbornene-2-trimethyl silyl carboxylate, 5-norbornene-2-2-hydroxyethyl carboxylate, 5-norbornene-2-methyl-2-methyl carboxylate, 5-norbornene-2-methyl cinnamate, 5-norbornene-2-methyl ethyl carbonate, 5-norbornene-2-methyl-t-butyl carbonate and 5-methoxy-2-norbornene can be cited as examples of monomers having a hydroxyl group, an ether group, a carboxyl group, an ester group, an acryloyl group or a methacryloyl group, 5-[(2,3-epoxypropoxy)methyl]-2-norbornene can be cited as an example of a monomer having an epoxy group, and 8-methoxycarbonyltetracyclo[4.4.0.1$^{2,5}$.1$^{7,10}$]dodec-3-ene, 8-t-butoxycarbonyltetracyclo[4.4.0.1$^{2,5}$.1$^{7,10}$]dodec-3-ene, 8-cyclohexyloxycarbonyltetracyclo[4.4.0.1$^{2,5}$.1$^{7,10}$]dodec-3-ene, 8-phenoxycarbonyltetracyclo[4.4.0.1$^{2,5}$.1$^{7,10}$]dodec-3-ene, 8-tetra hydropyranyloxycarbonyltetracyclo[4.4.0.1$^{2,5}$.1$^{7,10}$]dodec-3-ene, 8-methyl-8-methoxycarbonyltetracyclo[4.4.0.1$^{2,5}$.1$^{7,10}$]dodec-3-ene, 8-methyl-8-t-butoxycarbonyltetracyclo[4.4.0.1$^{2,5}$.1$^{7,10}$]dodec-3-ene, 8-methyl-8-cyclohexyloxycarbonyltetracyclo[4.4.0.1$^{2,5}$.1$^{7,10}$]dodec-3-ene, 8-methyl-8-acetoxytetracyclo[4.4.0.1$^{2,5}$.1$^{7,10}$]dodec-3-ene, 8,9-di(methoxycarbonyl)tetracyclo[4.4.0.1$^{2,5}$.1$^{7,10}$]dodec-3-ene, 8,9-di(1-propoxycarbonyl)tetracyclo[4.4.0.1$^{2,5}$.1$^{7,10}$]dodec-3-ene, 8,9-di(t-butoxycarbonyl)tetracyclo[4.4.0.1$^{2,5}$.1$^{7,10}$]dodec-3-ene, tetracyclo[4.4.0.1$^{2,5}$.1$^{7,10}$]dodec-3-ene-8-carboxylate, 8-methyltetracyclo[4.4.0.1$^{2,5}$.1$^{7,10}$]dodec-3-ene and 8-ethylidenetetracyclo[4.4.0.1$^{2,5}$.1$^{7,12}$]dodec-3-ene can be cited as examples of monomers having an epoxy group.

It is preferable for the cyclic olefin having an epoxy group to be a norbornene type additional (co)polymer which can be represented by general formula (2).

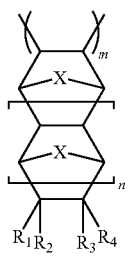

(2)

[In Formula (2), X is any of O, $CH_2$ or $(CH_2)_2$, n is an integer of 0 to 5, and m is an integer of 10 to 10,000. $R_1$ to $R_4$ are any of hydrogen, an alkyl group, an alkenyl group, an alkynyl group, an allyl group, an aryl group, an aralkyl group, a functional group containing an ester group, a functional group containing a ketone group, a functional group containing an ether group or a functional group containing an epoxy group. Though $R_1$ to $R_4$ may be different between the monomer units which are polymerized, at least one or more from among $R_1$ to $R_4$ in the units which are polymerized is a functional group having an epoxy group.]

As the cyclic olefin resin having an epoxy group, polymers which can be represented by the formulas (3) and (4) are preferable, from the point of view of the film properties after curing. When a norbornene monomer having an aralkyl group which can be represented by formula (4) is introduced into a polymer, the solubility of the polymer in a polar solvent such as cyclopentanone or heptanone, which is used as the solvent for a negative type developer increases, and thus, an advantage such that operation can be made much easier can be obtained.

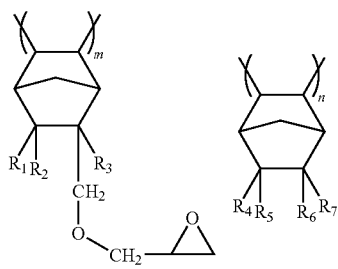

(3)

[In Formula (3), m and n are integers of 1 or higher. $R_1$ to $R_7$ are any of hydrogen, an alkyl group, an alkenyl group, an alkynyl group, an allyl group, an aryl group, an aralkyl group, a functional group containing an ester group, a functional group containing a ketone group or a functional group containing an ether group. $R_1$ to $R_7$ may be different between the monomer units which are polymerized.]

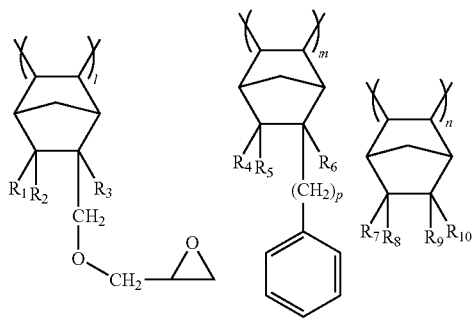

(4)

[In Formula (4), l, m and n are integers of 1 or higher, and p is an integer of 0 to 5. $R_1$ to $R_{10}$ are any of hydrogen, an alkyl group, an alkenyl group, an alkynyl group, an allyl group, an aryl group, an aralkyl group, a functional group containing an ester group, a functional group containing a ketone group or a functional group containing an ether group. $R_1$ to $R_{10}$ may be different between the monomer units which are polymerized.]

As the cyclic olefin resin having an epoxy group, polymers which can be represented by formula (5) are more preferable, from the point of view of the film properties after curing. A film having low elasticity can be obtained by introducing a monomer having a decyl group, and a film having low water absorbing properties, excellent resistance to chemicals and high solubility in polar solvents can be obtained by introducing a monomer having a phenyl ethyl group.

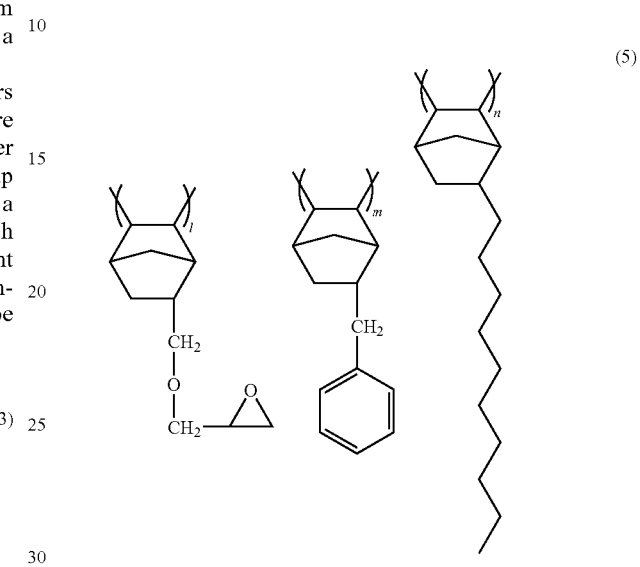

(5)

[In Formula (5), l, m and n are integers of 1 or higher.]

The content of the monomer having an epoxy group in the copolymer can be determined on the basis of whether or not there is cross-linking through exposure to light and a density of cross-linking which can bear the developer can be obtained. The content of the monomer having an epoxy group in the polymer is 5 mol % to 95 mol %, preferably 20 mol % to 80 mol %, and more preferably 30 mol % to 70 mol %. The thus obtained polymer exhibits excellent physical properties, such that water absorption is low (<0.3 wt %), the dielectric constant is low (<2.6), dielectric loss is low (0.001) and the glass transfer point is appropriate (170° C. to 400° C.).

As the cross-linking agent used to cross-link the cyclic olefin resin having an epoxy group, a photoreactive substance can be used. In addition, a curing agent which is activated through heating and the like can be used in addition to a photoreactive substance.

As the curing agent which can initiate a cross-linking reaction in the cyclic olefin resin having an epoxy group when heated, aliphatic polyamines, cycloaliphatic polyamines, aromatic polyamines, bisazides, acid anhydrides, dicarboxylic acid, polyphenol, polyamide and the like can be cited. As this curing agent, aliphatic polyamines such as hexamethylene diamine, triethylenetetramine, diethylenetriamine and tetraethylenepentamine; diaminocyclohexane, 3(4),8(9)-bis(aminomethyl)tricycle[5,2,1,0$^{2,6}$]decane; aliphatic polyamines such as 1,3-(diaminomethyl)cyclohexane, mensendiamine, isophoronediamine, N-aminoethylpiperazine, bis(4-amino-3-methylcyclohexyl)methane and bis(4-aminocyclohexyl) methane; aromatic polyamines such as 4,4'-diaminodiphenylether, 4,4'-diaminodiphenylmethane, α,α'-bis(4-aminophenyl)-1,3-diisopropylbenzene, α,α'-bis(4-aminophenyl)-1,4-diisopropylbenzene, 4,4'-diaminodiphenylsulfone and methaphenylenediamine; bisazides such as 4,4'-bisazidebenzal(4-methyl)cyclohexanone, 4,4'-diazidecalcone, 2,6-bis(4'-azidebenzal)cyclohexanone, 2,6-bis(4'-azidebenzal)-4-methyl-cyclohexanone, 4,4'-diazidediphenylsulfone, 4,4'-diazidediphenylmethane and 2,2'-diazidestilbene; acid anhydrides such as phthalic acid anhydride, pyromerit acid anhydride, benzophenone tetracarboxylic acid anhydride, nasic acid anhydride, 1,2-cyclohexane dicarboxylic acid anhydride, maleic acid anhydride modified polypropylene and maleic acid anhydride modified cyclic olefin resins; dicarboxylic acids such as fumaric acid, phthalic acid, maleic acid, trimeritic acid and hydroxamic acid; polyphenols such as phenol novolac resins and cresol novolac resins; and polyamides such as nylon-6, nylon-66, nylon-610, nylon-11, nylon-612, nylon-12, nylon-46, methoxy methylated polyamide, polyhexamethylene diamine, terephthalamide and polyhexamethylene isophthalamide can be cited as examples. These can be used alone, or a mixture of two or more types may be used.

As the photoreactive substance, photoacid generators can be used. Any publicly known compound can be used as the photoacid generator. Photoacid generators cross-link epoxy groups and cured afterwards, so that the adhesiveness with the substrate increases. As preferable photoacid generators, onium salts, halide compounds, sulfates and mixtures thereof can be cited. Examples of onium salts are diazonium salt, ammonium salt, iodonium salt, sulfonium salt, phosphate salt, arsonium salt and oxonium salt. There are no limitations in terms of the counteranion, as long as the compound can create counteranions with the above onium salt. Examples of counteranions are boric acid, arsonium acid, phosphoric acid, antimonic acid, sulfate and carboxylic acids and chlorides thereof, but the counteranions are not limited to these. As the photoacid generator of an onium salt, triphenylsulfonium tetra fluoroborate, triphenylsulfonium hexa fluoroarsenate, triphenylsulfonium hexa fluorophosphate, triphenylsulfonium diphenyliodonium tetrakis(pentafluorophenyl)borate, 4-thiophenoxy diphenylsulfonium tetra fluoroborate, 4-thiophenoxy diphenylsulfonium hexa fluoroantimonate, 4-t-butylphenyl diphenylsulfonium tetra fluoroborate, tris(4-methylphenyl)sulfonium tetra fluoroborate, tris(4-methylphenyl)sulfonium hexa fluorophosphate, tris(4-methoxyphenyl)sulfonium tetra fluoroborate, tris(4-methylphenyl)sulfonium hexa fluoroantimonate, tris(4-methylphenyl)sulfonium hexa fluorophosphate, tris(t-butylphenyl)sulfonium tetrakis(pentafluorophenyl)borate, diphenyliodonium tetra fluoroborate, diphenyliodonium hexa fluoroantimonate, diphenyliodonium tetrakis(pentafluorophenyl)borate, 4,4'-di-t-butylphenyliodonium tetrakis(pentafluorophenyl)borate, (4-methylphenyl-4-(1-methylethyl)phenyliodonium tetrakis(pentafluorophenyl)borate, 3,3-dinitrodiphenyliodonium tetra fluoroborate, 4,4-dinitrodiphenyliodonium tetra fluoroborate and 4,4-dinitrodiphenyliodonium hexa fluoroantimonate may be used alone or mixed for use.

Examples of the photoacid generator containing a halide are 2,4,6-tris(trichloromethyl)triazine, 2-allyl-4,6-bis(trichloromethyl)triazine, α,β,α-tribromomethyl phenyl sulfone, α,α-2,3,5,6-hexachloroxylene, 2,2-bis(3,5-dibromo-4-hydroxyphenyl)-1,1,1,3,3,3-hexafluoroxylene, 1,1,1-tris(3,5-dibromo-4-hydroxphenyl)ethane and mixtures of these.

Examples of the sulfonate based photoacid generator are 4,4'-di-t-butylphenyliodonium trifurate, 4,4',4"-tris(t-butylphenyl)sulfonium trifurate, 2-nitrobenzyl tocylate, 2,6-dinitrobenzyl tocylate, 2,4-dinitrobenzyl tocylate, 2-nitrobenzyl methyl sulfonate, 2-nitrobenzyl acetate, 9,10-dimethoxyanthracene-2-sulfonate, 1,2,3-tris(methanesulfonyloxy)benzene, 1,2,3-tris(ethanesulfonyloxy)benzene, 1,2,3-tris(propanesulfonyloxy) benzene and the like, but the sulfonate based photoacid generator is not limited to these.

Preferable photoacid generators are 4,4'-di-t-butylphenyliodonium trifurate, 4,4',4"-tris(t-butylphenyl)sulfonium trifurate, diphenyliodonium tetrakis(pentafluorophenyl)borate, triphenylsulfonium diphenyliodonium tetrakis(pentafluorophenyl)borate, 4,4'-di-t-butylphenyliodonium tetrakis(pentafluorophenyl)borate, tris(t-butylphenyl)sulfonium tetrakis(pentafluorophenyl)borate, 4-methyl phenyl-4-(1-methyl ethyl)phenyliodonium tetrakis(pentafluorophenyl)borate and mixtures of these.

The compounding ratio of the photoacid generator according to the present invention is 0.1 weight parts to 100 weight parts per 100 weight parts of the polymer, preferably 0.1 weight parts to 10 weight parts.

It is possible to use a sensitizing agent in the cyclic olefin resin composition to enhance the photosensitive properties if necessary. The sensitizing agent makes it possible to expand the range of wavelengths which can activate the photoacid generator, and an amount in such a range that the sensitizing agent does not directly affect the cross-linking reaction of the polymer can be added. The optimal sensitizing agent is a compound having a maximum coefficient of light absorption for light which is close to that coming from the used light source, so that absorbed energy can be efficiently transferred to the photoacid generator. Examples of the sensitizing agent for the photoacid generator are cycloaromatic series such as anthracene, pyrene and parylene and the like. Examples are 2-isopropyl-9H-thioxanthen-9-en, 4-isopropyl-9H-thioxanthen-9-on, 1-chloro-4-propoxy thioxanthen, phenothiazine and mixtures of these. The compounding ratio of the photoacid generator is 0.1 weight parts to 10 weight parts per 100 weight parts of the polymer, preferably 0.2 weight parts to 5 weight parts. In the case where the light source has a long wavelength, for example at the g line (436 nm) or at the i line (365 nm), the sensitizing agent is effective to activate the photoacid generator.

It is possible to increase the resolution by adding a small amount of acid capturing agent. The acid capturing agent absorbs acid which diffuses into portions which are not exposed to light during the photochemical reaction. As the acid capturing agent, second and third amines such as pyridine, lutidine, phenothiazine, tri-n-propyl amine and triethylamine and the like, can be cited, but the acid capturing agent is not limited to these. The compounding ratio of the acid capturing agent is 0.10 weight parts to 0.05 weight parts per 100 weight parts of the polymer.

In addition, additives such as a leveling agent, an antioxidant, a flame retardant, a plasticizer or a silane coupling agent, can be added to the resin composition which includes a cyclic olefin resin having an epoxy group and the photoacid generator if necessary.

In the present embodiment, these components are dissolved in a solvent and used in varnish form. As the solvent, there are nonreactive solvents and reactive solvents, and nonreactive solvents work as a carrier for the polymer or the additives and are removed during the process of coating and curing. The reactive solvents include a reactive group which is compatible with the curing agent added to the resin composition. The nonreactive solvent is hydrocarbon or an aromatic series. Alcane and cycloalcane hydrocarbon solvents such as pentane, hexane, heptane, cyclohexane and decahydronaphthalene, can be cited as examples, but the nonreactive solvent is not limited to these. The aromatic solvent is benzene, toluene, xylene or mesitylene. Diethyl ether, tetra hydrofuran, anisol, acetate, ester, lactone, ketone and amide are also useful. As the reactive solvent, cycloether compounds such as cyclohexane oxide and α-pinene oxide, aromatic cycloethers such as [methylene bis(4,1-phenyleneoxymethylene)]bisoxirane, cycloaliphatic vinyl ether compounds such as 1,4-cyclohexane dimethanol divinyl ether, and aromatic series such as bis(4-vinylphenyl)methane, may be used alone or mixed for use. Mesitylene and deca hydronaphthalene are preferable, and these are optimal for coating a resin on a substrate such as of silicon, silicon oxide, silicon nitride or silicon oxynitride.

The resin solid in the resin composition for forming the resin layer 22 is approximately 5 weight % to 60 weight %. Preferably it is approximately 30 weight % to 55 weight %, and more preferably it is approximately 35 weight % to 45 weight %. The viscosity of the solution is 10 cP to 25,000 cP, preferably 100 cP to 3,000 cP.

The resin composition for forming the resin layer 22 can be obtained simply by mixing an annular norbornene resin having an epoxy group and a photoacid generator, and if necessary, a solvent, a sensitizing agent, an acid capturing agent, a leveling agent, an antioxidant, a flame retardant, a plasticizer and a silane coupling agent.

Next, the resin layer 22 is prebaked at 90° C. to 140° C. so as to be dried.

After that, the resin layer 22 is selectively irradiated with light having a wavelength of 200 nm to 700 nm using a photo mask. As the light for irradiation, ultra violet rays, for example, are preferable.

As a result, portions of the resin layer 22 which are irradiated with light are photo-cured. After that, the resin layer 22 is baked. This process increases the reaction ratio of epoxy cross-linking. The baking conditions are 50° C. to 200° C. They are preferably 80° C. to 200° C., more preferably 90° C. to 130° C.

Next, the resin layer 22 is developed in a developer. As the developer, hydrocarbons such as alkane or cycloalkane, including pentane, hexane, heptane and cyclohexane, and aromatic hydrocarbon based solvents such as toluene mesitylene, xylene and mesitylene, can be used. In addition, terpens such as limonene, dipentene, pinene and mecrine, and ketones such as cyclopentanone, cyclohexanone and 2-heptanone, can be used, and organic solvents where an appropriate amount of surfactant is added to these are suitable for use.

As a result, portions which are not irradiated with light are dissolved and removed in the developer, and at the same time, portions which are irradiated with light remain without being dissolved in the developer. In the present embodiment, the resin layer 22 remains in regions of the transparent substrate 13 other than the portions R corresponding to regions facing the light receiving elements 20 on the transparent substrate portions 13A (see FIG. 7(B)). The resin layer 22 remains so as to surround the portions R.

Next, as shown in FIG. 8(A), an adhesive layer 23 is coated to the resin layer 22 in grid form. The adhesive layer 23 is coated along the surface of the resin layer 22 in grid form.

It is preferable for the adhesive layer 23 to be formed of a silica filler, an epoxy resin which is in liquid form at room temperature, and a curing agent, and thus include 1 weight % to 10 weight % of a silica filler in the component, and in addition, it is preferable for the silica filler to be ultra fine silica powder of which the average particle diameter is 2 nm to 500 nm.

In the case where the epoxy resin is not in liquid form at room temperature, a solvent is required for kneading with a silica filler. The solvent may create air bubbles and lower the strength of adhesion of the cured material and the thermal conductivity, and therefore, is not preferable.

Examples of the epoxy resin include bisphenol A, bisphenol F, polyglycidyl ether obtained through reaction between a phenol novolac and epichlorohydrin, which are in liquid form at room temperature, and cycloaliphatic epoxies such as vinyl cyclohexane dioxide, dicyclopentadiene dioxide and alicyclic diepoxy-adipate, and one type from among these may be used, or a plurality of types may be used together, but there are no particular limitations. Furthermore, it is possible to use a conventional epoxy resin such as n-butyl glycidyl ether, glycidyl versatate, styrene oxide, phenyl glycidyl ether, credyl glycidyl ether or butylphenyl glycidyl ether.

In addition, it is preferable to use bisphenol F and a potential amine compound such as dicyandiamide or hydrazide adipate, as the curing agent, and it is preferable for 2 weight % to 30 weight % of bisphenol F to be included in the adhesive. In the case of less than 2 weight %, the compounding amount is too small and the strength of adhesion is insufficient, while in the case of more than 30 weight %, the amount of the phenolic hydroxyl group relative to the epoxy group becomes excessive, and therefore, unreacted phenolic hydroxyl group remains in the cured material, which is not preferable.

The silica filler is an ultra fine silica powder of which the average particle diameter is 2 nm to 500 nm, and it is preferable for 1 weight % to 10 weight % to be contained in the adhesive.

In the case where the total amount of silica filler in the adhesive layer 23 is more than 1 weight %, problems which arise during coating such as sagging of the paste, are solved, while in the case of less than 10 weight %, lowering of the working efficiency such as clogging of the mask for screen printing, can be prevented.

In addition, additives such as a curing accelerator, a flexibility providing agent, a pigment, a dye or a defoaming agent, can be used in the adhesive layer 23 if necessary.

Next, the transparent substrate 13 is diced and a plurality of transparent substrate portions 13A are obtained. As the transparent substrate 13 is diced, the resin layer 22 and the adhesive layer 23 are also diced (see dicing lines D in FIG. 8(A)). As a result, as shown in FIG. 8(B), transparent substrate portions 13A provided with frame portions 21 can be obtained.

Here, it is preferable for the photo-cured resin layer 22 to have adhesiveness to such a degree as not to peel when the transparent substrate 13 is diced.

After that, a support substrate 15 on which a light receiving element 20 is installed is prepared. Then, a transparent substrate portion 13A and the support substrate 15 are placed so as to face each other. At this time, the support substrate 15 makes contact with the adhesive layer 23 of the frame portion 21. After that, heat is applied or pressure is applied through heating so that the support substrate 15 adheres to the transparent substrate portion 13A via the frame portion 21.

Through the above process, a light receiving device 2 can be manufactured.

Next, the working effects of the present embodiment are described.

In the present embodiment, the transparent substrate 13 is divided, and after that, a transparent substrate portion 13A and a support substrate 15 having a base substrate portion 12A are joined. Accordingly, the transparent substrate portion and the base substrate portion can be prevented from shifting in position in a great number of light receiving devices at the same time, unlike in the conventional art, and the yield in the manufacture can be increased.

In addition, a transparent substrate portion 13A and a support substrate 15 on which a light receiving element 20 is installed are joined after the transparent substrate 13 is divided, and thus, dicing or the like is not carried out after joining, and therefore, the transparent substrate portion 13A can be prevented from being damaged. As a result, the yield in the manufacture can be increased.

In addition, the resin layer 22 in a light receiving device 2 includes a cyclic olefin resin, so that moisture can be prevented from penetrating into the inner space surrounded by the resin layer 22.

As a result, condensation can be prevented in the transparent substrate portion 13A and the base substrate portion 12A from occurring, by preventing moisture from penetrating into the space surrounded by the resin layer 22.

Here, the present invention is not limited to the embodiments, and modifications and improvements are included in the present invention, as long as the object of the present invention can be achieved.

Though an adhesive film is pasted to the transparent substrate 13 or the base substrate 12 in the first and second embodiments, for example, the invention is not limited to this, and a resin layer 22 in varnish form may be coated to the transparent substrate 13 or the base substrate 12, and after that, the resin layer 22 may be formed in grid form, and an adhesive layer 23 may be provided on this resin layer 22 in grid form, as in the third embodiment.

Furthermore, an adhesive film as that in the first and second embodiments may be used instead of the resin layer 22 or adhesive layer 23 in the third embodiment.

In addition, in the first embodiment, the adhesive film is diced when the transparent substrate 13 is diced. In the same manner, in the third embodiment also, the resin layer 22 and the adhesive layer 23 are diced as the transparent substrate 13 is diced. However, the adhesive film, the resin layer 22 and the adhesive layer 23 may not be diced when the transparent substrate 13 is diced. In this case, in the same manner as in the second embodiment, a plurality of pieces of adhesive film or the resin layer 22 in frame form may remain on, for example, the transparent substrate 13. A plurality of pieces of adhesive film or the resin layer 22 in frame form surround portions which cover the light receiving portions 11 on the transparent substrate 13.

EXAMPLES

Next, examples of the present invention are described.

Example 1

1. Curing Resin which can be Cured Both Through Light and Heat (Synthesis of Acrylic Modified Phenolic Resin)

600 g of an MEK solution with 70% of a nonvolatile component of phenol novolac (Phenolite TD-2090-60M, made by Dainippon Ink and Chemicals, Incorporated) (approximately 4 equivalents of OH) was put in a flask of 2 L, and 1 g of tributylamine and 0.2 g of hydroquinone were added to this, and the mixture was heated to 110° C. 284 g (2 mol) of glycidyl methacrylate was dropped into the mixture for 30 minutes, and after that, the mixture was stirred for 5 hours at 110° C. in order to induce reaction, and thus, phenol novolac containing 80% of a methacryloyl group, which is a nonvolatile component, (ratio of conversion to methacryloyl group: 50%) was obtained.

2. Preparation of Resin Varnish 5.1 weight % of an acryl resin compound which is in liquid form at room temperature (triethylene glycol dimethacrylate: Neomer PM201, made by Sanyo Chemical Industries, Ltd.), which is a photo curing resin, 12.9 weight % of an epoxy resin (Epiclon N-865, made by Dainippon Ink and Chemicals, Incorporated) and 5.4 weight % of a silicone epoxy resin (BY16-115, made by Dow Corning Toray Co., Ltd.), which are thermosetting resins, 28.2 weight % of the (meth)acrylic modified phenolic resin synthesized above as a curing resin which can be cured both through light and heat, 1.9 weight % of a photopolymerization initiator (Irgacure 651 (2,2-dimethoxy-1,2-diphenyl ethane-1-on), made by Ciba Specialty Chemicals Co., Ltd.), 31.8 weight % of a porous filler (Molecularsieve 3A, made by Union Showa K. K.), which is a filler, and 14.7 weight % of methyl ethyl ketone, which is a solvent, were measured and stirred for 1 hour at 5000 rpm using a disperser, and thus, a resin varnish was prepared.

3. Manufacture of Adhesive Film

The resin varnish was coated to a support base polyester film (T100G, made by Mitsubishi Polyester Film GmbH, thickness: 25 μm) using a comma coater and dried for 10 minutes at 80° C., and thus, an adhesive film having a film thickness of 50 μm was obtained.

Example 2

Example 2 is the same as Example 1, except that a resin which can be cured both through light and heat was used.

As the resin that can be cured both through light and heat, an acryl copolymer resin having a carboxyl group and an acryl group in side chains (Cyclomer P, made by Daicel Chemical Industries, Ltd.) was used, and an adhesive film having a thickness of 50 μm was obtained.

Example 3

Example 3 is the same as Example 1, except that the compounding of the resin varnish was as follows.

6.8 weight % of an acryl resin monomer which is in liquid form at room temperature (Neomer PM201, made by Sanyo Chemical Industries, Ltd.), which is a photo curing resin, 13.7 weight % of a bis A novolac type epoxy resin (Epiclon N-865, made by Dainippon Ink and Chemicals, Incorporated), which is a thermosetting resin, 2.5 weight % of a silicone epoxy resin (BY16-115, made by Dow Corning Toray Co., Ltd.), 27.4 weight % of the methacrylic modified phenol novolac resin synthesized in Example 1, 0.9 weight % of a photopolymerization initiator (Irgacure 651, made by Ciba Specialty Chemicals Corporation Limited), 23.4 weight % of a silica filler (SE2050, made by Admatechs Co., Ltd.), which is an inorganic filler, and 25.3 weight % of methyl ethyl ketone, which is a solvent, were mixed.

An adhesive film having a thickness of 50 μm was obtained using this resin varnish.

The moisture permeability of the adhesive films obtained in the respective Examples was measured in the following manner.

The adhesive films were pasted together, and thus, a film having a film thickness of 100 μm was fabricated using a laminator of which the temperature was set at 60° C., and the film was irradiated with an amount of light of 750 mJ/cm$^2$ (wavelength: 365 nm) using a machine for light exposure, and after that, the film was thermally cured at 120° C. for 1 hour and at 180° C. for 1 hour. The film obtained after curing was evaluated in an environment of 40° C. and 90%, and 25° C. and 50%, following a water vapor permeability cup method (JIS Z0208), and thus, the moisture permeability was found.

TABLE 1

|  | Example 1 | Example 2 | Example 3 |
|---|---|---|---|
| moisture permeability 25° C. and 50% [g/m² · 24 h] | 8.5 | 8.4 | 2.3 |
| moisture permeability 40° C. and 90% [g/m² · 24 h] | 81.2 | 78.3 | 19.3 |

Next, a plurality of light receiving devices using adhesive films according to the respective examples were manufactured in accordance with the method shown in the first embodiment.

Here, the process for exposure to light was carried out with light of 750 mJ/cm² having a wavelength of 365 nm, and a development process was carried out using 3% TMAH (tetraammonium hydroxide) under such conditions that the spray pressure was 0.1 MPa and the time was 90 seconds. In addition, the adhesive film was patterned in grid form, and the pattern was arranged so as to surround regions covering the respective light receiving portions in frame form with a width of 100 μm.

In addition, transparent substrate portions and base substrate portions were pasted together through application of heat and pressure (temperature: 110° C., time: 10 seconds, pressure: 1 MPa). After that, the adhesive film was cured for 1 hour at 120° C., and afterwards, for 2 hours at 180° C.

All of the light receiving devices obtained in the respective examples had the desired properties, and furthermore, it was confirmed that operation did not have any problems. All of the light receiving devices had the desired properties, as described above, and therefore, it was found that the productivity can be increased according to the manufacturing method of the present invention.

Example 4

1. Fabrication of Cyclic Olefin Resin Composition (Composition for Forming Resin Layer)

An example of a copolymer (A-1) where decyl norbornene/glycidyl methyl ether norbornene=70/30 copolymer is cited.

All of the glass apparatuses were dried at 60° C. for 18 hours under 0.1 Torr. After that, the glass apparatuses were moved to a glow box and attached to the glow box. Ethyl acetate (917 g), cyclohexane (917 g), decyl norbornene (192 g, 0.82 mol) and glycidyl methyl ether norbornene (62 g, 0.35 mol) were put in a flask for reaction. The flask for reaction was taken out from the glow box and a dry nitrogen gas was introduced. Air was removed from the reactive chemical intermediate by passing a nitrogen gas through the solution for 30 minutes. 9.36 g (19.5 mmol) of a nickel catalyst, that is to say, bis(toluene)bis(perfluorophenyl)nickel, was dissolved in 15 ml of toluene, put in a syringe of 25 ml, taken out from the glow box and put in the flask for reaction. The mixture was stirred for 5 hours at 20° C. so that the reaction was completed. Next, a peracetic acid solution (975 mmol) was added and the mixture was stirred for 18 hours. When stirring was stopped, the solution was separated into a water layer and a solvent layer. After the water layer was separated, 1 l of distilled water was added, and the mixture was stirred for 20 minutes. The water layer was separated, and thus removed. Washing was carried out three times with 1 l of distilled water. After that, the polymer was put in methanol, precipitate was collected through filtering and sufficiently washed with water, and after that, dried in a vacuum. 243 g of the polymer after drying was collected (yield of 96%). The molecular amount of the obtained polymer was Mw=115,366, Mn=47,000, and Mw/Mn=2.45 through GPC. As for the composition of the polymer, it was found through H-NMR that decyl norbornene was 70% and epoxy norbornene was 30 mol %.

228 g of the resin synthesized in the above was dissolved in 342 g of deca hydronaphthalene, and after that, 4-methyl phenyl-4-(1-methyl ethyl)phenyliodonium tetrakis(pentafluorophenyl)borate (0.2757 g, $2.71 \times 10^{-4}$ mol), 1-chloro-4-propoloxy-9H-thioxanthon (0.826 g, $2.71 \times 10^{-4}$ mol), phenothiazine (0.054 g, $2.74 \times 10^{-4}$) and 3,5-di t-butyl-4-hydroxy hydrocinnamate (0.1378 g, $2.60 \times 10^{-4}$) were added and dissolved, and after that, the mixture was filtered with a filter made of a fluorine resin, and thus, a cyclic olefin resin composition was obtained.

2. Fabrication of Adhesive

Composition for Forming Adhesive Layer

An ultra fine silica powder (3.0 g) of which the average particle diameter was approximately 12 nm and diglycidyl ether (epoxy equivalent: 180, liquid form at room temperature) (91.0 g) obtained through reaction between bisphenol F and epichlorohydrin, bisphenol F (5.0 g) and dicyane diamide (1.0 g) were compounded and kneaded with three rolls, and thus, an insulating resin paste was obtained. This insulating resin paste was defoamed for 30 minutes in a vacuum chamber of 2 mmHg, and thus, an adhesive agent was obtained.

3. Fabrication of Light Receiving Device

A plurality of light receiving devices were fabricated in accordance with the method shown in the third embodiment.

Concretely, a cyclic olefin resin composition was coated on a transparent substrate using a spin coater, and after that, dried for 5 minutes at 110° C. using a hot plate, and thus, a resin layer having a film thickness of approximately 40 μm was obtained. This resin layer was exposed to light of 1500 mJ/cm² through a reticle in a broadband stepper exposure machine (made by Ultratech Stepper Inc.). After that, heat was applied, in order to accelerate the cross-linking reaction in portions exposed to light for 4 minutes using a hot plate at 90° C.

Next, the substrate was immersed in limonene for 30 seconds, and thus, portions which were not exposed to light were dissolved and removed, and after that, the substrate was rinsed for 20 seconds with isopropyl alcohol. As a result, the resin layer remained in regions other than the regions covering the light receiving elements on the transparent substrate and was processed in grid form. No peeling was observed in the pattern, and thus, it was confirmed that the adhesiveness at the time of development was excellent. After that, the resin layer was cured at 160° C. for 60 minutes, and thus, the cross-linking reaction was completed. The water absorbing ratio of this resin layer was 0.2%.

Next, the adhesive was coated to the resin layer through screen printing, and an adhesive layer was formed. After that, the transparent substrate was diced and a plurality of transparent substrate portions were obtained. Furthermore, a transparent substrate portion and a support substrate on which a light receiving element was installed were placed so as to face each other and heated at 100° C. for 60 minutes. As a result, the transparent substrate portion and the support substrate were pasted together.

The obtained light receiving device had the desired properties, and it was confirmed that operation did not have any problems in the light receiving device. All of the light receiving devices manufactured in this manner had desired properties, and therefore, it was found that the productivity can be increased according to the manufacturing method of the present invention.

Example 5

A terpolymer (A-2) of decyl norbornene/glycidyl methyl ether norbornene/phenetyl norbornene=55/30/15 was obtained in the same manner as in Example 4, except that decyl norbornene (129 g, 0.55 mol), glycidyl methyl ether norbornene (177 g, 0.30 mol) and phenetyl norbornene (29.7 g, 0.15 mol) were used instead of the decyl norbornene (192 g, 0.82 mol) and glycidyl methyl ether norbornene (62 g, 0.35 mol) of Example 4. The terpolymer was polymerized and precipitated again, 309 g of polymer was collected after drying (yield: 92%). The molecular weight of the obtained polymer was Mw=68000, Mn=30000 and Mw/Mn=2.3 through GPC. As for the composition of the polymer, it was found through H-NMR that decyl norbornene was 54%, epoxy norbornene was 31 mol % and phenetyl norbornene was 15 mol %.

A plurality of light receiving device were obtained by carrying out the same process as in Example 4.

The obtained light receiving devices had the desired properties, and it was confirmed that operation did not have any problems in the light receiving devices. All of the light receiving devices had the desired properties, as described above, and therefore, it was found that the productivity can be increased according to the manufacturing method of the present invention.

The invention claimed is:

1. A method of manufacturing a light receiving device, the light receiving device comprising a light receiving portion, a base substrate portion where this light receiving portion is provided, and a transparent substrate portion which is placed so as to face said base substrate portion and said light receiving portion, where
a resin layer containing a photo curing resin is placed between said transparent substrate portion and said base substrate portion so as to surround said light receiving portion, wherein
the method of manufacturing a light receiving device comprises steps (i) to (v) performed in the following order:
(i) providing a resin layer containing a photo curing resin on a transparent substrate where a plurality of said transparent substrate portions are integrated or on a base substrate where a plurality of said light receiving portions are provided and a plurality of said base substrate portions are integrated in such a manner that the resin layer covers said base substrate or said transparent substrate;
(ii) selectively irradiating said resin layer with light followed by a developing process so that said resin layer remains in regions surrounding at least the respective light receiving portions on said base substrate or in regions of said transparent substrate which surround portions corresponding to the regions facing said light receiving portions of said transparent substrate portions;
(iii) dividing said base substrate into units of said base substrate portions so that a plurality of said base substrate portions are obtained;
(iv) dividing said transparent substrate into units of said transparent substrate portions so that a plurality of said transparent substrate portions are obtained; and
(v) thereafter, joining said base substrate portion and said transparent substrate portion via said resin layer.

2. The method of manufacturing a light receiving device according to claim 1, wherein
said resin layer has adhesive properties.

3. The method of manufacturing a light receiving device according to claim 2, wherein
said resin layer is formed of a resin composition which includes said photo curing resin and a filler, and of which the moisture permeability is 30 [g/m$^2$·24h] or higher when measured in accordance with the JIS Z0208 B method.

4. The method of manufacturing a light receiving device according to claim 3, wherein
said filler includes zeolite.

5. The method of manufacturing a light receiving device according to claim 2, wherein
said resin layer includes a curing resin which can be cured both by light and heat.

6. The method of manufacturing a light receiving device according to claim 5, wherein
said curing resin which can be cured both by light and heat further includes a (meth)acrylic modified phenolic resin or a (meth)acryloyl containing (meth)acrylate polymer.

7. The method of manufacturing a light receiving device according to claim 1, wherein
said step in which said resin layer remains after the developing process comprises, at a later stage, providing an adhesive layer on a surface of said resin layer;
said base substrate portion and said transparent substrate portion are joined via said resin layer and said adhesive layer; and
said resin layer includes a cyclic olefin resin as said photo curing resin.

8. The method of manufacturing a light receiving device according to claim 7, wherein
said cyclic olefin resin is a norbornene resin.

9. A method of manufacturing a light receiving device, the light receiving device comprising a support substrate where a light receiving element having a light receiving portion and a base substrate portion provided with this light receiving portion is installed, and a transparent substrate portion which is placed so as to face the surface of said support substrate on which the light receiving element is provided, where
a resin layer containing a photo curing resin is placed between said support substrate and said transparent substrate portion so as to surround said light receiving element, wherein
the method of manufacturing a light receiving device comprises steps (i) to (iv) performed in the following order:
(i) providing a resin layer containing a photo curing resin on a transparent substrate where a plurality of transparent substrate portions are integrated in such a manner that the resin layer covers said transparent substrate;
(ii) selectively irradiating said resin layer with light followed by a developing process so that said resin layer remains so as to surround portions corresponding to the regions of said transparent substrate facing the light receiving elements in said transparent substrate portions;
(iii) dividing said transparent substrate into units of the transparent substrate portions so that a plurality of said transparent substrate portions are obtained; and
(iv) thereafter, joining support substrates and said transparent substrate portions via said resin layer after said light receiving elements are installed on said support substrates.

10. The method of manufacturing a light receiving device according to claim 9, wherein said resin layer has adhesive properties.

11. The method of manufacturing a light receiving device according to claim 10, wherein said resin layer is formed of a resin composition which includes said photo curing resin and a filler, and of which the moisture permeability is 30 [$g/m^2 \cdot 24h$] or higher when measured in accordance with the JIS Z0208 B method.

12. The method of manufacturing a light receiving device according to claim 11, wherein said filler includes zeolite.

13. The method of manufacturing a light receiving device according to claim 10, wherein said resin layer includes a curing resin which can be cured both by light and heat.

14. The method of manufacturing a light receiving device according to claim 13, wherein said curing resin which can be cured both by light and heat further includes a (meth)acrylic modified phenolic resin or a (meth)acryloyl containing (meth)acrylate polymer.

15. The method of manufacturing a light receiving device according to claim 9, wherein said step in which said resin layer remains after the developing process comprises, at a later stage, providing an adhesive layer on a surface of said resin layer;

said support substrate and said transparent substrate portion are joined via said resin layer and said adhesive layer; and said resin layer includes a cyclic olefin resin as said photo curing resin.

16. The method of manufacturing a light receiving device according to claim 15, wherein said cyclic olefin resin is a norbornene resin.

* * * * *